United States Patent
Kamat et al.

(10) Patent No.: US 8,659,363 B2
(45) Date of Patent: Feb. 25, 2014

(54) OTA-BASED CURRENT-MODE FILTER AND OSCILLATOR

(75) Inventors: Dattaguru. V. Kamat, Karnataka (IN);
Ananda Mohan P. V., Karnataka (IN);
Gopalakrishna Prabhu K, Karnataka (IN)

(73) Assignee: Manipal University, Udupi, Karnataka (IN)

( * ) Notice: Subject to any disclaimer, the term of this patent is extended or adjusted under 35 U.S.C. 154(b) by 101 days.

(21) Appl. No.: 13/381,977

(22) PCT Filed: Dec. 1, 2010

(86) PCT No.: PCT/IB2010/055524
§ 371 (c)(1),
(2), (4) Date: Jan. 3, 2012

(87) PCT Pub. No.: WO2012/014019
PCT Pub. Date: Feb. 2, 2012

(65) Prior Publication Data
US 2012/0161891 A1 Jun. 28, 2012

(30) Foreign Application Priority Data
Jul. 26, 2010 (IN) .......................... 2117/CHE/2010

(51) Int. Cl.
*H03B 5/20* (2006.01)

(52) U.S. Cl.
USPC .......................... 331/135; 331/108 B; 331/57

(58) Field of Classification Search
USPC ....... 331/135, 136, 137, 108 B, 57, 111, 143; 327/552
See application file for complete search history.

(56) References Cited

U.S. PATENT DOCUMENTS

| | | | |
|---|---|---|---|
| 5,001,441 A | 3/1991 | Gen-Kuong | |
| 5,852,385 A | 12/1998 | Izumikawa | |
| 5,936,466 A | 8/1999 | Andoh et al. | |
| 6,559,786 B2 | 5/2003 | Groiss et al. | |
| 8,264,289 B2 * | 9/2012 | Chang et al. | ............ 331/108 B |
| 2005/0219014 A1 | 10/2005 | Dong | |
| 2007/0057732 A1 | 3/2007 | Chang et al. | |
| 2010/0031205 A1 | 2/2010 | Chang et al. | |

OTHER PUBLICATIONS

Shaker et al., "New CMOS fully-differential transconductor and application to a fully-differential Gm-C filter." Etri Journal 28.2 (2006): 175-181.*
Notification of Transmittal of the International Search Report and the Written Opinion of the International Searching Authority, Apr. 1, 2011.
Geiger R. L. et al, "Active Filter Design Using Operational Transconductance Amplifiers: A Turorial", IEEE Circuits and Devices Magazine, vol. 1, Mar. 1985, pp. 20-32, "First-Order Filter Structures", Figs 4, 5, 7.

(Continued)

Primary Examiner — Ryan Johnson
(74) Attorney, Agent, or Firm — Ren-Sheng International

(57) ABSTRACT

Techniques are generally described herein related to filters including first operational transconductance amplifier (first OTA) and a second operational transconductance amplifier (second OTA). In some examples described herein, the first OTA and second OTA have substantially the same transconductance. The first and second OTAs can be configured to realize filters such as first-order all-pass filters, second-order all-pass filters, higher-order all-pass filters, and quadrature oscillators.

4 Claims, 11 Drawing Sheets

(56) References Cited

OTHER PUBLICATIONS

P.V. Ananda Mohan, "Generation of OTA-C Filter Structures from Active RC Filter Structures", IEEE Transactions on Circuits and Systems, May 1990, pp. 656-660, vol. 37.

P.V. Anada Mohan, "Novel OTA-C Filter Structures Using Grounded Capacitors", IEEE, Proc.ISCAD, 1991, pp. 1347-1350, India.

T. Deliyannis et al., "Continuous-Time Active Filter Design", CRC Press, 1999, Florida, USA, Figure 3, 8-16.

Al-Hashimi, B.M., "Current Mode Filter Structure Based on Dual Output Transconductance Ampifiers", Electronics Letters, Jan. 4, 1996, pp. 25-26, vol. 32, No. 1.

Al-Hashimi, B.M., Dudek F. and Moniri M., "Current-Mode Group-Delay Equalisation Using Pole-Zero Mirroring Technique", IEEE Proc.-Circuits Devices Syst., Aug. 2000, pp. 257-264, vol. 147, No. 4.

Yichuang Sun, J.K. Fidler, "Structure Generation of Current-Mode Two Integrator Loop Dual Output-OTA Grounded Capacitor Filters", IEEE Transactions on Circuits and Systems, Sep. 1996, pp. 659-663, vol. 43, No. 9, "Part II: Analog and Digital Signal Processing".

Al-Hashimi, B.M et al., "Integrated Universal Biquad Based on Triple-Output OTAs and Using Digitally Programmable Zeros", IEEE Proc.-Circuits Devices Syst., Jun. 1998, pp. 192-196, vol. 145, No. 3.

Frank Dudek, "Investigation of Monolithic Transconductor-Capacitor Video-Filters", PhD Thesis, Staffordshire University, May 1999, pp. 1-209.

Jie Wu et al., "Design of Current-Mode Ladder Filters Using Coupled-Biquads", IEEE Transactions on Circuits and Systems, Nov. 1998, pp. 1445-1454, vol. 45, No. 11, "Part II: Analog and Digital Signal Processing".

Takao Tsukutani et al., "Electronically Tunable Current-Mode OTA-C Biquad Using Two-Integrator Loop Structure", Frequenz, 2006, pp. 53-56, vol. 60, "Fachverlag Schiele & Schon GmbH MarkgrafenstraBe 11", Germany.

Robert Tarmy et al., "Very High-Q Insensitive Active RC Networks", IEEE Transactions on Circuit Theory, Aug. 1970, pp. 358-366, vol. CT-17, No. 3.

N.A. McDonald et al., "High-Q Factor Insensitive Active RC Networks, Similar to the Tarmy-Ghausi Circuit But Using Single-Ended Operational Amplifiers", Electronics Letters, Sep. 7, 1972, pp. 458-459, vol. 8, No. 18.

Donald T. Comer et al., "A High-Frequency Integrable Bandpass Filter Configuration", IEEE Transactions on Circuits and Systems, Oct. 1997, pp. 856-861 vol. 44, No. 10, "Part II: Analog and Digital Signal Processing".

Ali Toker et al., "Current-Mode All-Pass Filters Using Current Differencing Buffered Amplifier and a New High-Q Bandpass Filter Configuration", IEEE Transactions on Circuits and Systems, Sep. 2000, pp. 949-954, vol. 47, No. 9, "Part II: Analog and Digital Signal Processing".

Jose Silva-Martinez et al., "A 10.7 MHz 68-dB SNR CMOS Continuous-Time Filter with On-Chip Automatic Tuning", IEEE Journal of Solid State Circuits, Dec. 1992, pp. 1843-1853, vol. 27, No. 12.

Shahram Minaei et al., "DVCC Based Current-Mode First-Order All-Pass Filter and It's Application", IEEE International Conference on Electronics Circuits and Systems, 2003, pp. 276-279.

Dattaguru V. Kamat et al., "Novel First-Order and Second-Order Current Mode Filters Using Dual-Output OTAs and Grounded Capacitors", Asia Pacific IEEE Region 10 (TENCON 2008) International Conference, 2008, India.

Lee Chen-Nong, et al: "High-order mixed-mode OTA-C universal filter", AEU International Journal of Electronics and Communications, vol. 63, Issue 6, Jun. 2009, pp. 517-521.

\* cited by examiner

OTA-BASED CURRENT-MODE FILTER AND OSCILLATOR

CROSS-REFERENCE TO RELATED APPLICATIONS

The present application is a 371 application of International Application PCT/IB2010/055524, filed on Dec. 1, 2010 and entitled "OTA-BASED CURRENT-MODE FILTER AND OSCILLATOR." The International Application claims priority to Indian Patent Application 2117/CHE/2010, filed on Jul. 26, 2010. The Indian Patent Application and the International Application, including any appendices or attachments thereof, are incorporated by reference herein in their entireties.

TECHNICAL FIELD

The present disclosure relates generally to a filter and more specifically to an operational transconductance amplifier (OTA) based current-mode filter and oscillator.

BACKGROUND

Unless otherwise indicated herein, the materials described in this section are not prior art to the claims in this application and are not admitted to be prior art by inclusion in this section.

All-pass filters are widely used in the analog signal processing as group-delay equalizers in video, communication, and instrumentation applications. First-order all-pass filters can also be used as a building block to realize different types of second-order filters and quadrature oscillators. Some popular approaches in the continuous-time integrated filter design involve at least an operational transconductance amplifier and capacitor (OTA-C) due to its certain desired bandwidth and dynamic range.

SUMMARY

Some embodiments of the present disclosure may generally relate to a filter. An example filter may include a first circuit having a first node and a second node, wherein the first node is a common node that is either a circuit ground node, a voltage reference node, or a power supply node. The example filter may also include a first operational transconductance amplifier (OTA), which includes an inverting input configured to receive a first input current signal, a non-inverting input, coupled to the second node, an inverting output, coupled to the second node, and configured to provide a first output current signal, and a non-inverting output configured to provide a second output current signal. The example filter may further include a second OTA, which includes a non-inverting input, coupled to the first node, an inverting input coupled to the inverting input of the first OTA, a non-inverting output, coupled to the inverting input of the first OTA, and configured to provide a third output current signal, and an inverting output, coupled to the second node, configured to provide a fourth output current signal. The first OTA and the second OTA have substantially the same transconductance. The example filter may be configured such that the first and the second output current signals are proportional to the transconductance of the first OTA and a voltage difference between the non-inverting input and the inverting input of the first OTA, and the third and the fourth output current signals are proportional to the transconductance of the second OTA and a voltage difference between the non-inverting input and the inverting input of the second OTA.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
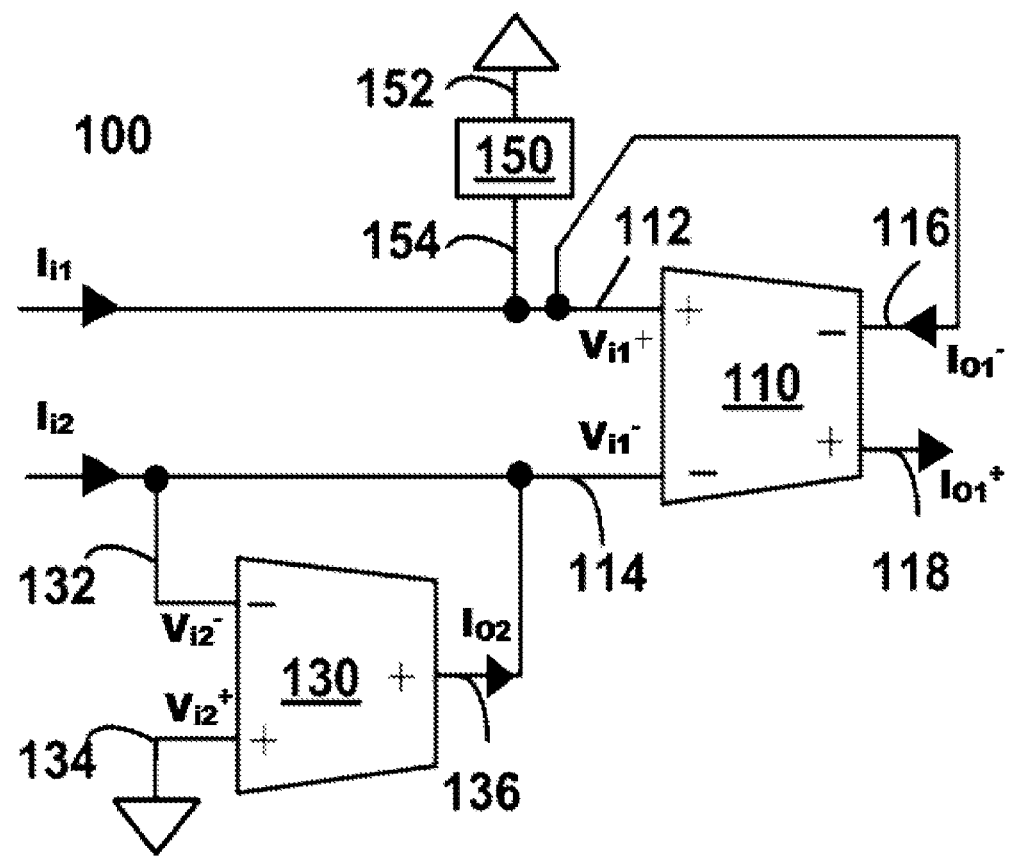
FIG. 1 shows a simplified block diagram of an example OTA-based non-inverting (+) type filter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is drawn, inter alia, to systems, devices and methods related to current-mode operational transconductance amplifier (OTA) based filters.

Briefly stated, techniques are generally described herein related to filters including a first operational transconductance amplifier (first OTA) and a second operational transconductance amplifier (second OTA). In some examples described herein, the first OTA and second OTA have substantially the same transconductance. The first and second OTAs can be configured to realize filters such as first-order all-pass filters, second-order all-pass filters, higher-order all-pass filters, and quadrature oscillators.

FIG. 1 illustrates a simplified block diagram of an example current-mode OTA-based filter 100, arranged in accordance with at least some embodiments of the present disclosure. The filter 100 includes a dual-output-OTA (DO-OTA) 110 with a non-inverting (+) input 112, an inverting (−) input 114, an inverting (−) output 116, and a non-inverting (+) output 118. The filter 100 also includes a single-output-OTA (SO-OTA) 130 with an inverting (−) input 132, a non-inverting (+) input 134, and a non-inverting (+) output 136. The filter 100 further includes a circuit 150 with a first terminal 152 and a second terminal 154. The DO-OTA 110 has a characteristic transconductance $g_{m1}$. The SO-OTA 130 has a characteristic transconductance $g_{m2}$. The DO-OTA 110 and the SO-OTA 130 may have substantially the same transconductance $g_m$. The circuit 150 has a characteristic admittance $Y(s)$.

As shown in FIG. 1, the non-inverting (+) input 112 of the DO-OTA 110 is coupled to the second terminal 154 of the circuit 150 and the inverting (−) output 116 of the DO-OTA 110. The inverting (−) input 114 of the DO-OTA 110 is coupled to the inverting (−) input 132 and the non-inverting (+) output 136 of the SO-OTA 130. The first terminal 152 of the circuit 150 and the non-inverting (+) input 134 of the SO-OTA 130 are coupled to a power supply terminal, where the power supply terminal has a predetermined voltage reference level (e.g., $V_X$, $V_{DD}$, $V_{SS}$, $V_{GND}$, etc.). Current inputs, $I_{i1}$ and $I_{i2}$, are fed to the non-inverting (+) input 112 and the inverting (−) input 114 of the DO-OTA 110, respectively. The non-inverting (+) output 118 of the DO-OTA 110 provides a first current output, $I_{O1}^+$, and the inverting (−) output 116 of the DO-OTA 110 provides a second current output, $I_{O1}^-$, where $I_{O1}^+=-I_{O1}^-$. The prefixed minus sign of "$-I_{O1}^-$" indicates that the first current output, $I_{O1}^+$ and the second current output, $I_{O1}^-$, are in the opposite direction. For example, the second current output, $I_{O1}^-$ flows into the inverting (−) output 116 of the DO-OTA 110, and the first current output, $I_{O1}^+$, flows out of the non-inverting (+) output 118. The non-inverting (+) output 136 of the SO-OTA 130 provides a current output, $I_{O2}^+$. The current outputs ($I_{O1}^+$, $-I_{O1}^-$) of the DO-OTA 110 are determined by the voltage ($V_{i1}^+$, $V_{i1}^-$) applied across inputs 112 and 114, i.e., $I_{O1}^+=-I_{O1}^-=g_{m1}\cdot(V_{i1}^+-V_{i1}^-)$. The current output of the SO-OTA 130 ($I_{O2}$) is determined by the voltage applied across inputs 134 and 132 ($V_{i2}^+$, $V_{i2}^-$), i.e., $I_{O2}=g_{m2}\cdot(V_{i2}^+-V_{i2}^-)$. The illustrated SO-OTA 130 behaves like a resistor of value $1/g_{m2}$.

The input-output relation of the filter 100 is shown in Eq. (1) below.

$$I_{o1^+} = -I_{o1^-} = \frac{g_{m1}(g_{m2}\cdot I_{i1} - Y(s)\cdot I_{i2})}{g_{m2}(g_{m1} + Y(s))} \quad \text{Eq. (1)}$$

By configuring $I_{i1}=I_{i2}=I_{in}$ and $g_{m1}=g_{m2}=g_m$, and substituting these parameters into Eq. (1), the transfer function of the filter 100 is shown in Eq. (2) below. In this case, the filter 100 realizes the following transfer function:

$$H(s) = \frac{I_o}{I_{in}} = -\frac{(Y(s) - g_m)}{(Y(s) + g_m)} \quad \text{Eq. (2)}$$

By configuring $I_{i1}=0$, $I_{i2}=I_{in}$, and $g_{m1}=g_{m2}=g_m$, and substituting these parameters into Eq. (1), the transfer function of the filter 100 is shown in Eq. (3) below. In this case, the filter 100 realizes the following transfer function:

$$H(s) = \frac{I_o}{I_{in}} = -\frac{Y(s)}{(Y(s) + g_m)} \quad \text{Eq. (3)}$$

By configuring $I_{i1}=I_{in}$ and $I_{i2}=0$, the SO-OTA 130 is therefore not needed and the inverting input of the DO-OTA 110 is coupled to the power supply terminal with a predetermined voltage level (e.g., ground). By configuring $g_{m1}=g_m$ and substituting these parameters into Eq. (1), the transfer function of the filter 100 is shown in Eq. (4) below. In this case, the filter 100 realizes the following transfer function:

$$H(s) = \frac{I_o}{I_{in}} = \frac{g_m}{(Y(s) + g_m)} \quad \text{Eq. (4)}$$

The circuit 150 can be implemented with the circuit shown in FIG. 9(a). A capacitor 910 with a capacitance value of $C_1$ is coupled between the second terminal 154 of the circuit 150 and a power supply terminal, where the power supply terminal has a predetermined voltage reference level (e.g., ground as shown in FIG. 9(a)). The admittance of the circuit 150 is $Y(s)=sC_1$. By configuring $I_{i1}=I_{i2}=I_{in}$, $g_{m1}=g_{m2}=g_m$, and $Y(s)=sC_1$, and substituting these parameters into Eq. (1) or Eq. (2), the transfer function of the filter 100 is shown in Eq. (5) below. The filter 100 acts as a first-order non-inverting type all-pass filter.

$$H(s) = \frac{I_o}{I_{in}} = -\frac{\left(s - \frac{g_m}{C_1}\right)}{\left(s + \frac{g_m}{C_1}\right)} \quad \text{Eq. (5)}$$

By configuring $I_{i1}=0$, $I_{i2}=I_{in}$, $g_{m1}=g_{m2}=g_m$, and $Y(s)=sC_1$, and substituting these parameters into Eq. (1) or Eq. (3), the transfer function of the filter 100 is shown in Eq. (6) below. The filter 100 acts as a first-order high-pass filter.

$$H(s) = \frac{I_o}{I_{in}} = -\frac{s}{\left(s + \frac{g_m}{C_1}\right)} \quad \text{Eq. (6)}$$

Similarly, by configuring $I_{i1}=I_{in}$ and $I_{i2}=0$, the SO-OTA 130 is not needed and the inverting input of the DO-OTA 110 is coupled to the power supply terminal with a predetermined voltage level (e.g., ground). By configuring $g_{m1}=g_m$ and $Y(s)=sC_1$, and substituting these parameters into Eq. (1) or Eq. (4), the transfer function of the filter 100 is shown in Eq. (7) below. The filter 100 acts as a first-order low-pass filter.

$$H(s) = \frac{I_o}{I_{in}} = \frac{\frac{g_m}{C_1}}{\left(s + \frac{g_m}{C_1}\right)} \quad \text{Eq. (7)}$$

A second-order all-pass filter can be realized by implementing the circuit 150 with the circuit shown in FIG. 9(b). A capacitor 920 with a capacitance value of $C_1$ in parallel with an inductor 930 with an inductance value of $L_1$ are coupled between the second terminal 154 of the circuit 150 and a power supply terminal, where the power supply terminal has a predetermined voltage reference level (e.g., ground as shown in FIG. 9(b)). In this example, the admittance of the circuit 150 is $Y(s)=(sC_1+1/(sL_1))$. By configuring $I_{i1}=I_{i2}=I_{in}$, $g_{m1}=g_{m2}=g_m$, and $Y(s)=(sC_1+1/(sL_1))$, and substituting these parameters into Eq. (1) or Eq. (2), the transfer function of the second-order all-pass filter is shown in Eq. (8) below.

$$H(s) = \frac{I_o}{I_{in}} = -\frac{(s^2 \cdot L_1 \cdot C_1 - s \cdot L_1 \cdot g_m + 1)}{(s^2 \cdot L_1 \cdot C_1 + s \cdot L_1 \cdot g_m + 1)} \quad \text{Eq. (8)}$$

When the circuit 150 is implemented with the circuit shown in FIG. 9(b), a second-order band-stop transfer function can also be realized by configuring $I_{i1}=0$, $I_{i2}=I_{in}$, $g_{m1}=g_{m2}=g_m$. The transfer function of the second-order band-stop filter can be obtained by substituting $I_{i1}=0$, $I_{i2}=g_{in}$, $g_{m1}=g_{m2}=g_m$, and $Y(s)=(sC_1+1/(sL_1))$ into Eq. (1) or Eq. (3) as follows:

$$H(s) = \frac{I_o}{I_{in}} = -\frac{(s^2 \cdot L_1 \cdot C_1 + 1)}{(s^2 \cdot L_1 \cdot C_1 + s \cdot L_1 \cdot g_m + 1)}.$$

Similarly, when the circuit 150 is implemented with the circuit shown in FIG. 9(b), a second-order band-pass can also be realized by configuring $I_{i1}=I_{in}$, $I_{i2}=0$, $g_{m1}=g_m$. In this case, SO-OTA 130 is not needed and the inverting input of DO-OTA 110 is coupled to a power supply terminal with a predetermined voltage reference level (e.g., ground). The transfer function of the second-order band-pass filter can be obtained by substituting $I_{i1}=I_{in}$, $I_{i2}=0$, $g_{m1}=g_m$, and $Y(s)=(sC_1+1/(sL_1))$ into Eq. (1) or Eq. (4) as follows:

$$H(s) = \frac{I_o}{I_{in}} = \frac{s \cdot L_1 \cdot g_m}{(s^2 \cdot L_1 \cdot C_1 + s \cdot L_1 \cdot g_m + 1)}$$

Figure 10:
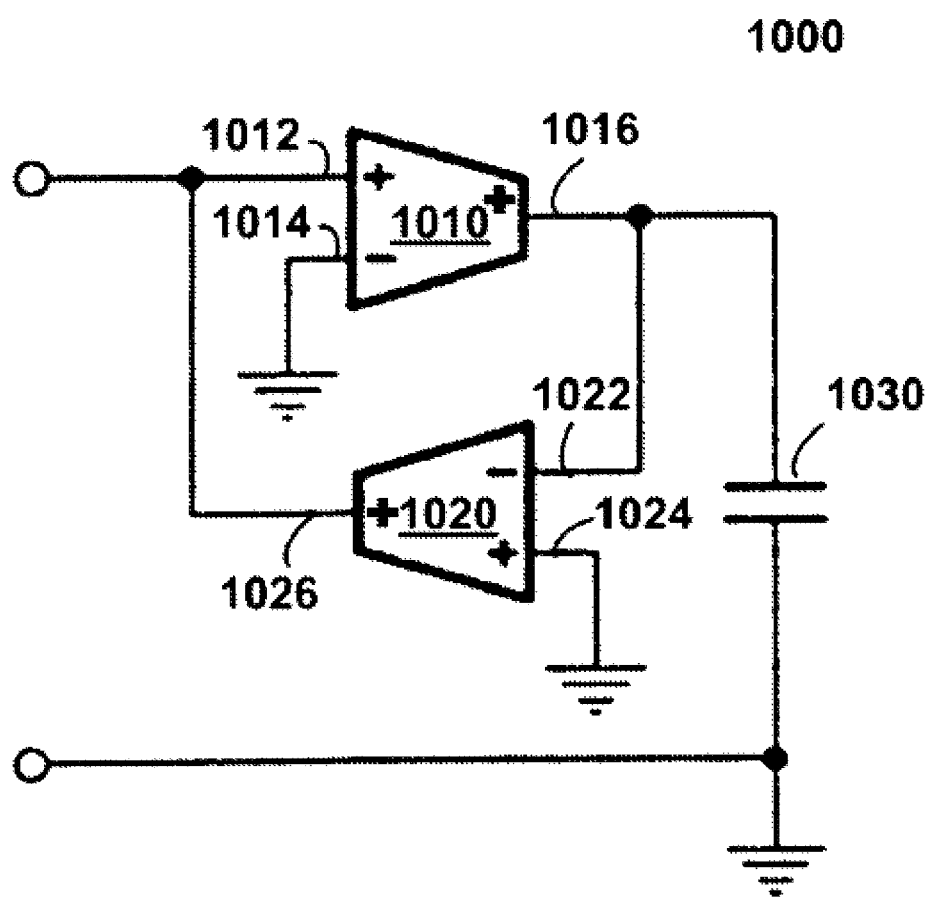
FIG. 10 shows a simplified block diagram of an example OTA-C simulated inductor.

In another example, the inductor 930 can be substituted with an operational transconductance and capacitance (OTA-C) simulated inductor 1000 as shown in FIG. 10. The OTA-C simulated inductor 1000 includes a capacitor 1030 with a capacitance value of $C_2$ and two SO-OTAs 1010 and 1020 respectively with characteristic transconductances $g_{m1010}$ and $g_{m1020}$. Each of the SO-OTAs 1010 and 1020 has a non-inverting (+) input, an inverting (−) input, and a non-inverting (+) output. The non-inverting (+) input 1012 of the OTA 1010 is coupled to the non-inverting (+) output 1026 of the OTA 1020. The non-inverting (+) output 1016 of the OTA 1010 and the inverting (−) input 1022 of the OTA 1020 are coupled to one end of the capacitor 1030. The other end of the capacitor 1030, the inverting (−) input 1014 of the OTA 1010, and the non-inverting (+) input 1024 of the OTA 1020 are coupled to a voltage reference level (e.g., ground as shown in FIG. 10). The inductance of the OTA-C simulated conductor 1000 is given by Eq. (9a) below.

$$L_{OTA-C} = \frac{C_2}{g_{m1010}g_{m1020}} \quad \text{Eq. (9a)}$$

Consequently, the transfer function of the second-order all-pass, band-stop, and band-pass filters with the OTA-C simulated inductor 1000 can be deduced by substituting the inductance $L_1$ in the above equations with the inductance $L_{OTA-C}$ in Eq. (9a).

Figure 9:
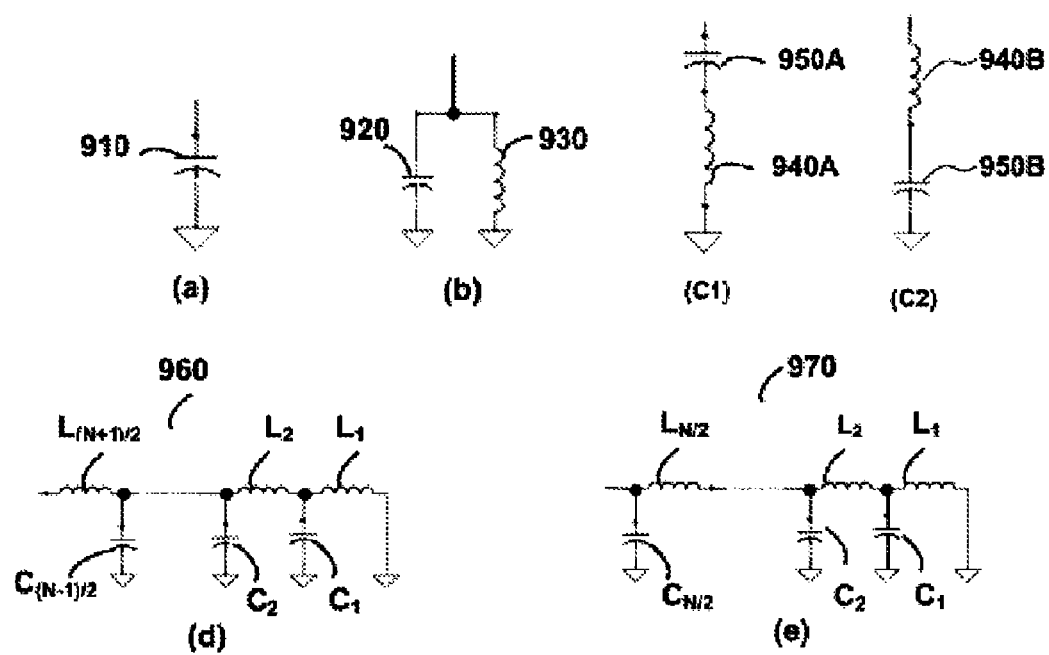
FIG. 9 shows several example circuit elements for the OTA-base filter design.

Another second-order all-pass filter can be realized by implementing the circuit 150 with the circuit shown in FIG. 9(c1) or FIG. 9(c2). An impedance containing an inductor 940A with an inductance value of $L_1$ in series with a capacitor 950A with a capacitance value $C_1$ is coupled between the second terminal 154 of the circuit 150 and a power supply terminal, where the power supply terminal has a predetermined voltage reference level (e.g., ground as shown in FIG. 9(c1)). Alternately, an impedance containing a capacitor 950B with a capacitance value $C_1$ in series with an inductor 940B with an inductance value of $L_1$ is coupled between the second-terminal 154 of the circuit 150 and a power supply terminal, where the power supply terminal has a predetermined voltage reference level (e.g., ground as shown in FIG. 9(c2)). The admittance of the circuit 150 is $Y(s)=1/(sL_1+1/(sC_1))$. By configuring $I_{i1}=I_{i2}=I_{in}$, $g_{m1}=g_{m2}=g_m$, and $Y(s)=1/(sL_1+1/(sC_1))$, and substituting these parameters into Eq. (1) or Eq. (2), the transfer function of the second-order all-pass filter can be obtained as follows:

$$H(s) = \frac{I_o}{I_{in}} = \frac{(s^2 \cdot g_m \cdot L_1 \cdot C_1 - s \cdot C_1 + g_m)}{(s^2 \cdot g_m \cdot L_1 \cdot C_1 + s \cdot C_1 + g_m)}$$

A second-order band-pass filter can be realized by configuring $I_{i1}=0$, $I_{i2}=I_{in}$ and $g_{m1}=g_{m2}=g_m$. The transfer function of the band-pass filter can be obtained by substituting $I_{i1}=0$, $I_{i2}=I_{in}$, $g_{m1}=g_{m2}=g_m$, and $Y(s)=1/(sL_1+1/(sC_1))$ into Eq. (1) or Eq. (3).

$$H(s) = \frac{I_o}{I_{in}} = \frac{-s \cdot C_1}{(s^2 \cdot g_m \cdot L_1 \cdot C_1 + s \cdot C_1 + g_m)}$$

A second-order band-stop can also be realized by configuring $I_{i1}=I_{in}$, $I_{i2}=0$, $g_{m1}=g_m$. In this case, SO-OTA 130 is not needed and the inverting input of DO-OTA 110 is coupled to a power supply terminal with a predetermined voltage level (e.g., ground). The transfer function of the band-stop filter can be obtained by substituting $I_{i1}=I_{in}$, $I_{i2}=0$, $g_{m1}=g_m$, and $Y(s)=1/(sL_1+1/(sC_1))$ into Eq. (1) or Eq. (4).

$$H(s) = \frac{I_o}{I_{in}} = \frac{s^2 \cdot g_m \cdot L_1 \cdot C_1 + g_m}{(s^2 \cdot g_m \cdot L_1 \cdot C_1 + s \cdot C_1 + g_m)}$$

Figure 11:
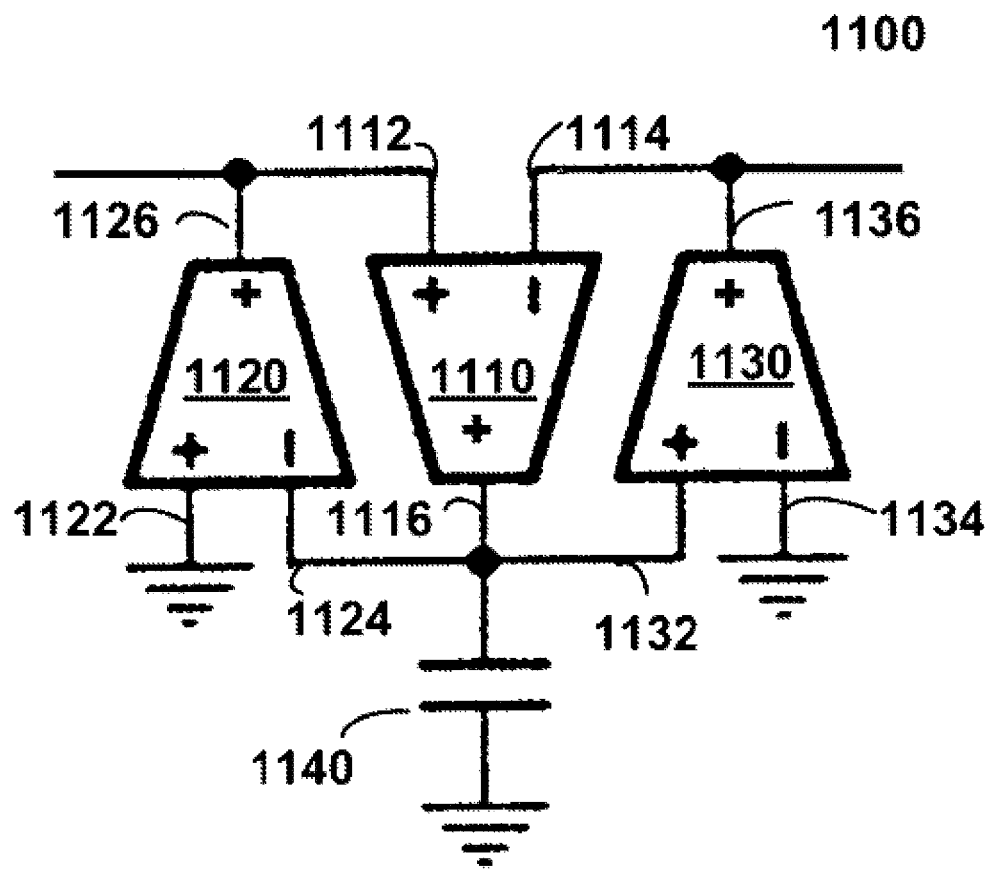
FIG. 11 shows a simplified block diagram of another example OTA-C simulated inductor, all arranged in accordance with at least some embodiments of the present disclosure described herein.

The inductor 940A in FIG. 9(c1) may be substituted with another OTA-C simulated inductor 1000 as shown in FIG. 10. Alternately, the inductor 940B in FIG. 9(c2) may be substituted with another OTA-C simulated inductor 1100 as shown in FIG. 11. The OTA-C simulated inductor 1100 includes a capacitor 1140 with a capacitance value of $C_3$ and three SO-OTAs 1110, 1120, and 1130 respectively with characteristic transconductances $g_{m1110}$, $g_{m1120}$, and $g_{m1130}$. Each of the SO-OTAs 1110, 1120, and 1130 has a non-inverting (+) input, an inverting (−) input, and a non-inverting (+) output. The non-inverting (+) input 1112 of the OTA 1110 is coupled to the non-inverting (+) output 1126 of the OTA 1120. The inverting (−) input 1114 of the OTA 1110 is coupled to the non-inverting (+) output 1136 of the OTA 1130. The non-inverting (+) output 1116 of the OTA 1110, the inverting (−) input 1124 of the OTA 1120, the non-inverting (+) input 1132 of the OTA 1130 are coupled to one end of the capacitor 1140. The other end of the capacitor 1140, the non-inverting (+) input 1122 of the OTA 1120, and the inverting (−) input 1134 of the OTA 1130 are coupled to a voltage reference level (e.g., ground as shown in FIG. 11). By configuring $g_{m1110}=g_{m3}$ and $g_{m1120}=g_{m1130}=g_{m4}$, the inductance of the OTA-C simulated conductor 1100 is given by Eq. (9b) below. Consequently, the transfer function of the second-order all-pass, band-pass, and band-reject filters with the OTA-C simulated inductor 1100 can be obtained by substituting the inductance $L_1$ in the above equations with the inductance $L_{OTA-C}$ in Eq. (9b).

$$L_{OTA-C} = \frac{C_3}{g_{m3}g_{m4}} \quad \text{Eq. (9b)}$$

In some embodiments, the circuit arrangement using the inductor 940A of FIG. 9(c1) may involve two OTAs but may be affected by the parasitic capacitance of both the terminals of the floating capacitor. On the other hand, the circuit arrangement using the inductor 940B of FIG. 9(c2) may involve three OTAs but may not be affected by the parasitic capacitance of the capacitor bottom plate as it uses grounded capacitors throughout.

A generalized N-th order all-pass filter can be realized by implementing the circuit 150 with a LC ladder network 960 as shown in FIG. 9(d) or a LC ladder network 970 as shown in FIG. 9(e). In FIG. 9(d), the LC ladder network 960 includes (N+1)/2 inductor(s) that are coupled in a series configuration from the input of the LC network to a power supply terminal, where the power supply terminal has a predetermined voltage reference level (e.g., ground as shown in FIG. 9(d)). The LC ladder network 960 also includes (N−1)/2 capacitor(s), each coupled from a respective tap point between the inductors to a power supply terminal with a predetermined voltage reference level (e.g., ground as shown in FIG. 9(d)).

In FIG. 9(e), the LC ladder network 970 includes N/2 inductor(s) that are coupled together in a series configuration from the input of the LC network to a power supply terminal with a predetermined voltage reference level (e.g., ground as shown in FIG. 9(e)). LC ladder network 970 also includes N/2 capacitor(s), each of the capacitor(s) being coupled between one of the inductor(s) and a power supply terminal with a predetermined voltage reference level (e.g., ground as shown in FIG. 9(e)).

The N-th order all-pass filter can be realized by configuring $I_{i1}=I_{i2}=I_{in}$ and $g_{m1}=g_{m2}=g_m$. The transfer function of the N-th order all-pass filters can be obtained by substituting for Y(s) the admittance of the LC ladder networks 960 or 970 into Eq. (2) above. In some examples, the inductor(s) in FIG. 9(d) and FIG. 9(e) can be implemented with the OTA-C simulated inductor 1000 or 1100, respectively shown in FIGS. 10 and 11.

Figure 2:
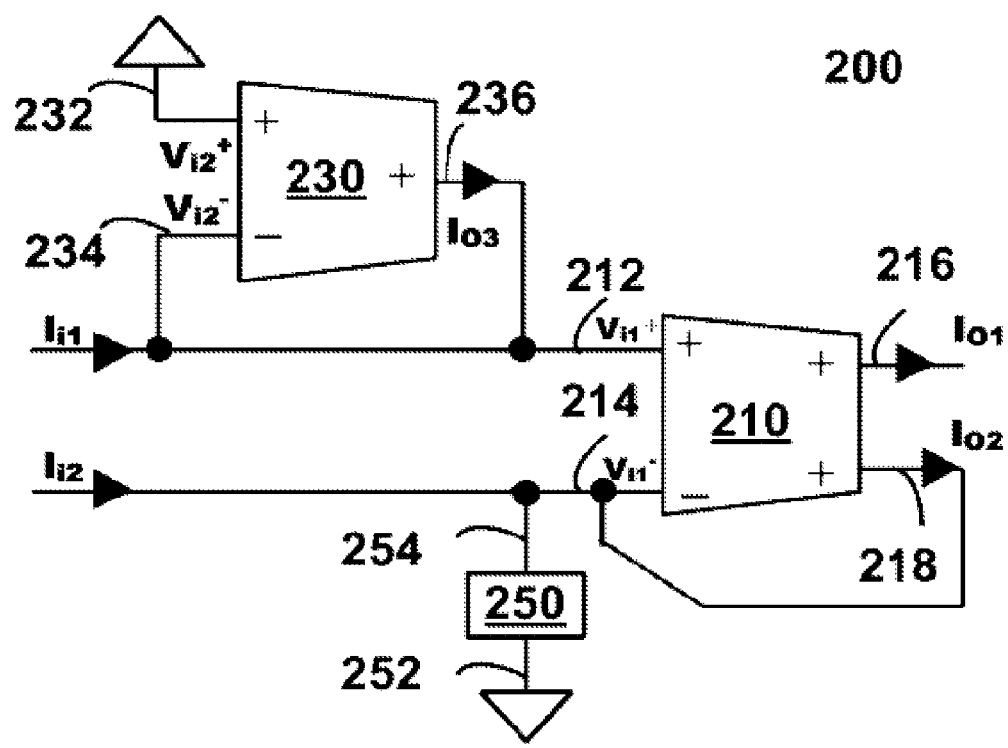
FIG. 2 shows a simplified block diagram of an example OTA-based inverting (−) type filter.

FIG. 2 illustrates a simplified block diagram of an example current-mode OTA-based filter 200, arranged in accordance with at least some embodiments of the present disclosure. The filter 200 includes a DO-OTA 210 with a non-inverting (+) input 212, an inverting (−) input 214, and two non-inverting (+) outputs 216 and 218. The filter 200 also includes a SO-OTA 230 with a non-inverting (+) input 232, an inverting (−) input 234, and a non-inverting (+) output 236. The filter 200 further includes a circuit 250 with a first terminal 252 and a second terminal 254. The DO-OTA 210 has a characteristic transconductance $g_{m1}$. The SO-OTA 230 has a characteristic transconductance $g_{m2}$. The DO-OTA 210 and the SO-OTA 230 may have substantially the same characteristic transconductance $g_m$. The circuit 250 has a characteristic admittance Y(s). The illustrated OTA 230 behaves like a resistor of value $1/g_{m2}$.

The inverting (−) input 214 of the DO-OTA 210 is coupled to the second terminal 254 of the circuit 250 and the non-inverting (+) output 218 of the DO-OTA 210. The non-inverting (+) input 212 of the DO-OTA 210 is coupled to the inverting (−) input 234 and also the non-inverting (+) output 236 of the SO-OTA 230. The first terminal 252 of the circuit 250 and the non-inverting (+) input 232 of the SO-OTA 230 are coupled to a power supply terminal with a predetermined voltage reference level (e.g., ground). Current inputs, $I_{i1}$ and $I_{i2}$, are fed to the non-inverting (+) input 212 and the inverting (−) input 214 of the DO-OTA 210, respectively. The non-inverting (+) outputs 216 and 218 of the DO-OTA 210 provide current outputs, $I_{O1}$ and $I_{O2}$, respectively. The non-inverting (+) output 236 of the SO-OTA 230 provides a current output, $I_{O3}$. The current outputs ($I_{O1}$, $I_{O2}$) of the DO-OTA are determined by the voltage ($V_{i1}^+$, $V_{i1}^-$) applied across inputs 212 and 214, i.e., $I_{O1}=I_{O2}=g_{m1}\cdot(V_{i1}^+-V_{i1}^-)$. The current output of the SO-OTA ($I_{O3}$) is determined by the voltage applied across inputs 232 and 234 ($V_{i2}^+$, $V_{i2}^-$), i.e., $I_{O3}=g_{m2}\cdot(V_{i2}^+-V_{i2}^-)$.

The input-output relation of the filter 200 is shown in Eq. (10) below.

$$I_{o1} = \frac{g_{m1}(Y(s)\cdot I_{i1} - g_{m2}\cdot I_{i2})}{g_{m2}(g_{m1} + Y(s))} \quad \text{Eq. (10)}$$

By configuring $I_{i1}=I_{i2}=I_{in}$ and $g_{m1}=g_{m2}=g_m$, and substituting these parameters into Eq. (10), the transfer function of the filter 200 is shown in Eq. (11) below. In this case, the filter 200 realizes the following transfer function:

$$H(s) = \frac{I_o}{I_{in}} = \frac{(Y(s) - g_m)}{(Y(s) - g_m)} \quad \text{Eq. (11)}$$

By configuring $I_{i1}=0$, $I_{i2}=I_{in}$, and $g_{m1}=g_m$ (OTA 230 is not needed and the non-inverting input of DO-OTA 210 is coupled to a power supply terminal with a predetermined voltage level (e.g., ground)), and substituting these parameters into Eq. (10), the transfer function of the filter 200 is shown in Eq. (12) below. In this case, the filter 200 acts as a low-pass filter.

$$H(s) = \frac{I_o}{I_{in}} = \frac{-g_m}{(Y(s) + g_m)} \quad \text{Eq. (12)}$$

By configuring $I_{i1}=I_{in}$, $I_{i2}=0$, and $g_{m1}=g_{m2}=g_m$, and substituting these parameters into Eq. (10), the transfer function of the filter 200 is shown in Eq. (13) below.

$$H(s) = \frac{I_o}{I_{in}} = \frac{Y(s)}{(Y(s) + g_m)} \quad \text{Eq. (13)}$$

The circuit 250 can be implemented with the circuit shown in FIG. 9(a). A capacitor 910 with a capacitance value of $C_1$ is coupled between the second terminal 254 of the circuit 250 and a power supply terminal, where the power supply terminal has a predetermined voltage reference level (e.g., ground as shown in FIG. 9(a)). The admittance of the circuit 250 is $Y(s)=sC_1$. By configuring $I_{i1}=I_{i2}=I_{in}$, $g_{m1}=g_{m2}=g_m$, and $Y(s)=sC_1$, and substituting these parameters into Eq. (10) or Eq. (11), the transfer function of the filter 200 is shown in Eq. (14) below. The filter 200 acts as a first-order inverting type all-pass filter.

$$H(s) = \frac{I_o}{I_{in}} = \frac{\left(s - \frac{g_m}{C_1}\right)}{\left(s + \frac{g_m}{C_1}\right)} \quad \text{Eq. (14)}$$

By configuring $I_{i1}=0$, $I_{i2}=I_{in}$, $g_{m1}=g_m$, and $Y(s)=sC_1$. SO-OTA 230 is not needed and the non-inverting input of DO-OTA 210 is coupled to a power supply terminal with a predetermined voltage level (e.g., ground). After substituting these parameters into Eq. (10) or Eq. (12), the transfer function of the filter 200 is shown in Eq. (15) below. The filter 200 acts as a first-order low-pass filter.

$$H(s) = \frac{I_o}{I_{in}} = \frac{\frac{g_m}{C_1}}{\left(s + \frac{g_m}{C_1}\right)} \quad \text{Eq. (15)}$$

Similarly, by configuring $I_{i1}=I_{in}$, $I_{i2}=0$, $g_{m1}=g_{m2}=g_m$, and $Y(s)=sC_1$, and substituting these parameters into Eq. (10) or Eq. (13), the transfer function of the filter 200 is shown in Eq. (16) below. The filter 200 acts as a first-order high-pass filter.

$$H(s) = \frac{I_o}{I_{in}} = \frac{s}{\left(s + \frac{g_m}{C_1}\right)} \quad \text{Eq. (16)}$$

A second-order all-pass filter can be realized by implementing the circuit 250 with the circuit shown in FIG. 9(b). A capacitor 920 with a capacitance value of $C_1$ in parallel with an inductor 930 with an inductance value of $L_1$ are coupled between the second terminal 254 of the circuit 250 and a power supply terminal, where the power supply terminal has a predetermined voltage reference level (e.g., ground as shown in FIG. 9(b)). In this example, the admittance of the circuit 250 is $Y(s)=(sC_1+1/(sL_1))$. By configuring $I_{i1}=I_{i2}=I_{in}$, $g_{m1}=g_{m2}=g_m$, and $Y(s)=(sC_1+1/(sL_1))$, and substituting these parameters into Eq. (10) or Eq. (11), the transfer function of the second-order all-pass filter is shown in Eq. (17) below.

$$H(s) = \frac{I_o}{I_{in}} = \frac{(s^2 \cdot L_1 \cdot C_1 - s \cdot L_1 \cdot g_m + 1)}{(s^2 \cdot L_1 \cdot C_1 + s \cdot L_1 \cdot g_m + 1)} \quad \text{Eq. (17)}$$

When the circuit 250 is implemented with the circuit shown in FIG. 9(b), a second-order band-pass can also be realized by configuring $I_{i1}=0$, $I_{i2}=I_{in}$, $g_{m1}=g_m$. In this case, SO-OTA 230 is not needed and the non-inverting input of DO-OTA 210 is coupled to a power supply terminal with a predetermined voltage reference level (e.g., ground). The transfer function of the second-order band-pass filter can be obtained by substituting $I_{i1}=0$, $I_{i2}=I_{in}$, $g_{m1}=g_m$, and $Y(s)=(sC_1+1/(sL_1))$ into Eq. (10) or Eq. (12) as follows:

$$H(s) = \frac{I_o}{I_{in}} = \frac{-s \cdot g_m \cdot L_1}{(s^2 \cdot L_1 \cdot C_1 + s \cdot g_m \cdot L_1 + 1)}$$

Similarly, when the circuit 250 is implemented with the circuit shown in FIG. 9(b), a second-order band-stop can also be realized by configuring $I_{i1}=I_{in}$, $I_{i2}=0$, $g_{m1}=g_{m2}=g_m$. The transfer function of the second-order band-stop filter can be obtained by substituting $I_{i1}=I_{in}$, $I_{i2}=0$, $g_{m1}=g_{m2}=g_m$, and $Y(s)=(sC_1+1/(sL_1))$ into Eq. (10) or Eq. (13) as follows:

$$H(s) = \frac{I_o}{I_{in}} = \frac{s^2 \cdot L_1 \cdot C_1 + 1}{(s^2 \cdot L_1 \cdot C_1 + s \cdot g_m \cdot L_1 + 1)}$$

In another example, the inductor 930 can be substituted with an OTA-C simulated inductor 1000 as shown in FIG. 10. As mentioned above, the inductance of the OTA-C simulated conductor 1000 is given by Eq. (9a). Consequently, the transfer function of the second-order all-pass, band-stop, and band-pass filters with the OTA-C simulated inductor 1000 can be deduced by substituting the inductance $L_1$ in the above equation with the inductance $L_{OTA-C}$ in Eq. (9a).

Another second-order all-pass filter can be realized by implementing the circuit 250 with the circuit shown in FIG. 9(c1) or FIG. 9(c2). An impedance containing the inductor 940A with an inductance value of $L_1$ in series with the capacitor 950A with a capacitance value $C_1$ is coupled between the second terminal 254 of the circuit 250 and a power supply terminal, where the power supply terminal has a predetermined voltage reference level (e.g., ground as shown in FIG. 9(c1)). Alternately, an impedance containing the capacitor 950B with a capacitance value $C_1$ in series with the inductor 940B with an inductance value $L_1$ is coupled between the second-terminal 254 of the circuit 250 and a power supply terminal, where the power supply terminal has a predetermined voltage reference level (e.g., ground as shown in FIG. 9(c2)). The admittance of the circuit 250 is $Y(s)=1/(sL_1+1/(sC_1))$. By configuring $I_{i1}=I_{i2}=I_{in}$, $g_{m1}=g_{m2}=g_m$, and $Y(s)=1/(sL_1+1/(sC_1))$, and substituting these parameters into Eq. (10) or Eq. (11), the transfer function of the second-order all-pass filter can be obtained as follows:

$$H(s) = \frac{I_o}{I_{in}} = \frac{(s^2 \cdot g_m \cdot L_1 \cdot C_1 - s \cdot C_1 + g_m)}{(s^2 \cdot g_m \cdot L_1 \cdot C_1 + s \cdot C_1 + g_m)}$$

A second-order band-stop filter can be realized by configuring $I_{i1}=0$, $I_{i2}=I_{in}$ and $g_{m1}=g_m$. In this case, SO-OTA 230 is not needed and the non-inverting input of DO-OTA 210 is coupled to a power supply terminal with a predetermined voltage reference level (e.g., ground). The transfer function of the second-order band-stop filter can be obtained by substituting $I_{i1}=0$, $I_{i2}=I_{in}$, $g_{m1}=g_m$, and $Y(s)=1/(sL_1+1/(sC_1))$ into Eq. (10) or Eq. (12) as follows:

$$H(s) = \frac{I_o}{I_{in}} = \frac{s^2 \cdot g_m \cdot L_1 \cdot C_1 + g_m}{(s^2 \cdot g_m \cdot L_1 \cdot C_1 + s \cdot C_1 + g_m)}$$

A second-order band-pass can also be realized by configuring $I_{i1}=I_{in}$, $I_{i2}=0$, $g_{m1}=g_{m2}=g_m$. The transfer function of the second-order band-pass filter can be obtained by substituting $I_{i1}=I_{in}$, $I_{i2}=0$, $g_{m1}=g_{m2}=g_m$, and $Y(s)=1/(sL_1+1/(sC_1))$ into Eq. (10) or Eq. (13) as follows:

$$H(s) = \frac{I_o}{I_{in}} = \frac{s \cdot C_1}{(s^2 \cdot g_m \cdot L_1 \cdot C_1 + s \cdot C_1 + g_m)}$$

The inductor 940A in FIG. 9(c1) may be substituted with another OTA-C simulated inductor 1000 as shown in FIG. 10. The inductance of the OTA-C simulated inductor 1000 is given by Eq. (9a). Consequently, the transfer function of the second-order all-pass, band-pass, and band-stop filters with the OTA-C simulated inductor 1000 can be deduced by substituting the inductance $L_1$ in the above equation with the inductance $L_{OTA-C}$ in Eq. (9a). Alternatively, the inductor 940B in FIG. 9(c2) may be substituted with another OTA-C simulated inductor 1100 as shown in FIG. 11. The inductance of the OTA-C simulated inductor 1100 is given by Eq. (9b). Consequently, the transfer function of the second-order all-pass, band-pass, and band-stop filters with the OTA-C simulated inductor 1100 can be deduced by substituting the inductance $L_1$ in the above equation with the inductance $L_{OTA-C}$ in Eq. (9b).

In some embodiments, the circuit arrangement using the inductor 940A of FIG. 9(c1) may involve two OTAs but may be affected by the parasitic capacitance of both the terminals of the floating capacitor. On the other hand, the circuit arrangement using the inductor 940B of FIG. 9(c2) may involve three OTAs but may not be affected by the parasitic capacitance of the capacitor bottom plate as it uses grounded capacitors throughout.

A generalized N-th order all-pass filter can be realized by implementing the circuit 250 with a LC ladder network 960 as shown in FIG. 9(d) or a LC ladder network 970 as shown in FIG. 9(e). In FIG. 9(d), the LC ladder network 960 includes (N+1)/2 inductor(s) that are coupled in a series configuration from the input of the LC network to a power supply terminal with a predetermined voltage reference level (e.g., ground as shown in FIG. 9(d)). The LC ladder network 960 also includes (N−1)/2 capacitor(s), each coupled from a respective tap point between the inductors to the power supply terminal with the predetermined voltage reference level (e.g., ground as shown in FIG. 9(d)).

In FIG. 9(e), the LC ladder network 970 includes N/2 inductor(s) that are coupled together in a series configuration from the input of the LC network to a power supply terminal with a predetermined voltage reference level (e.g., ground as shown in FIG. 9(e)). LC ladder network 970 also includes N/2 capacitor(s), each of the capacitor(s) being coupled between one of the inductor(s) and the power supply terminal with the predetermined voltage reference level (e.g., ground as shown in FIG. 9(e)).

The N-th order all-pass filter can be realized by configuring $I_{i1}=I_{i2}=I_{in}$ and $g_{m1}=g_{m2}=g_m$. The transfer function of the N-th order all-pass filters can be obtained by substituting for Y(s) the admittance of the LC ladder networks 960 or 970 into Eq. (11) above. In some examples, the inductor(s) in FIG. 9(d) and FIG. 9(e) can be implemented with the OTA-C simulated inductor 1000 or 1100, respectively shown in FIGS. 10 and 11.

Figure 3:
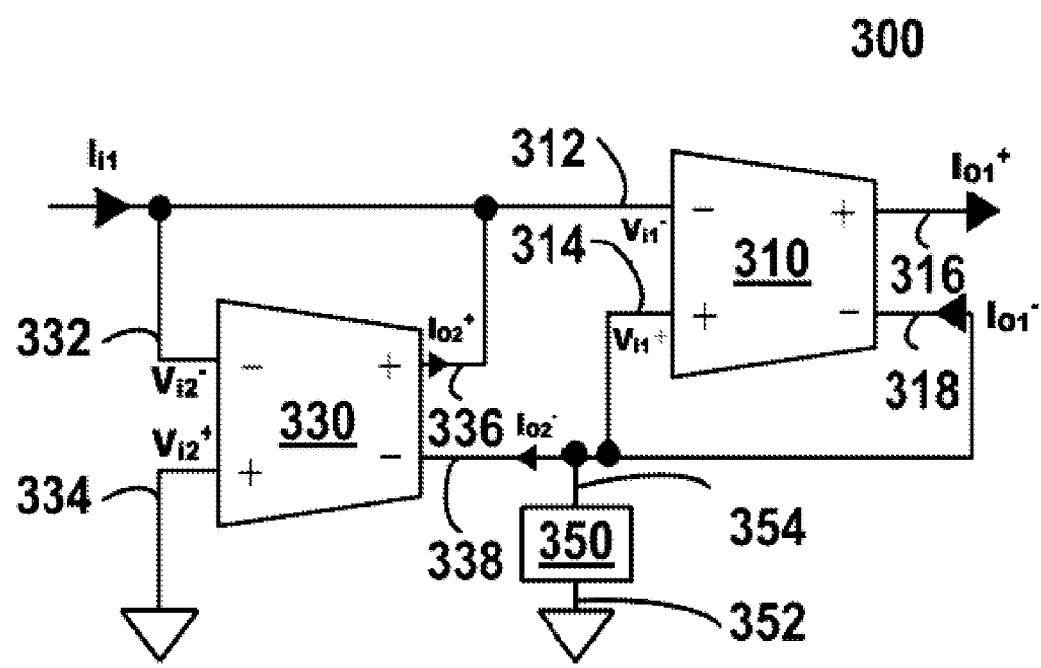
FIG. 3 shows a simplified block diagram of an example single input OTA-based non-inverting (+) type filter.

FIG. 3 illustrates a simplified block diagram of an example OTA-based current-mode filter 300 arranged in accordance with at least some embodiments of the present disclosure. The filter 300 includes a DO-OTA 310 with an inverting (−) input 312, a non-inverting (+) input 314, a non-inverting (+) output 316, and an inverting (−) output 318. The filter 300 also includes a DO-OTA 330 with an inverting (−) input 332, a non-inverting (+) input 334, a non-inverting (+) output 336, and an inverting (−) output 338. The filter 300 further includes a circuit 350 with a first terminal 352 and a second terminal 354. The first DO-OTA 310 has a characteristic transconductance $g_{m1}$. The second DO-OTA 330 has a characteristic transconductance $g_{m2}$. The DO-OTA 310 and the DO-OTA 330 may have substantially the same characteristic transconductance $g_m$. The circuit 350 has a characteristic admittance Y(s). The illustrated DO-OTA 330 behaves like a resistor of value $1/g_{m2}$.

The non-inverting (+) input 314 of the DO-OTA 310 is coupled to the second terminal 354 of circuit 350, the inverting (−) output 338 of the DO-OTA 330, and the inverting (−) output 318 of the DO-OTA 310. The inverting (−) input 312 of the DO-OTA 310 is coupled to the inverting (−) input 332 and the non-inverting (+) output 336 of the DO-OTA 330. The first terminal 352 of the circuit 350 and the non-inverting (+) input 334 of the DO-OTA 330 are coupled to a power supply terminal with a predetermined voltage reference level (e.g., $V_X$, $V_{DD}$, $V_{SS}$, $V_{GND}$, etc.). A current input, $I_{i1}$, is fed to the inverting (−) input 312 of the DO-OTA 310 and the inverting (−) input 332 of the DO-OTA 330. The inverting (−) output 338 of the DO-OTA 330 provides a current output, $I_{O2}^-$, which is substantially the same as the current input, $I_{i1}$. The non-inverting (+) output 316 of the OTA 310 provides a current output, $I_{O1}^+$, and the inverting (−) output 318 of the DO-OTA 310 provides a current output, $I_{O1}^-$. The current outputs ($I_{O1}^+$, $I_{O1}^-$) of the DO-OTA 310 are determined by the voltage ($V_{i1}^+$, $V_{i1}^-$) applied across inputs 314 and 312, where $I_{O1}^+=-I_{O1}^-=g_{m1} \cdot (V_{i1}^+-V_{i1}^-)$. The current outputs ($I_{O2}^+$, $-I_{O2}^-$) of the DO-OTA 330 are determined by the voltage ($V_{i2}^+$, $V_{i2}^-$) applied across inputs 334 and 332, where $I_{O2}^+=-I_{O2}^-=g_{m2} \cdot (V_{i2}^+-V_{i2}^-)$.

The input-output relation of the filter 300 is the same as the filter 100 in FIG. 1 and as given in Eq. (1) above. Accordingly, by configuring $I_{i1}=I_{in}$ and $g_{m1}=g_{m2}=g_m$, the filter 300 realizes the transfer function given by Eq. (2) above.

The circuit 350 can be implemented with the circuit shown in FIG. 9(a). A capacitor 910 with a capacitance value of $C_1$ is coupled between the second terminal 354 of the circuit 350 and a power supply terminal with a predetermined voltage reference level (e.g., ground as shown in FIG. 9(a)). The admittance of the circuit 350 is $Y(s)=sC_1$. By configuring $I_{i1}=I_{in}$, $g_{m1}=g_{m2}=g_m$, and $Y(s)=sC_1$, and substituting these parameters into Eq. (1) or Eq. (2), the filter 300 acts as a first-order non-inverting type all-pass filter and the transfer function is shown in Eq. (5) above.

A second-order all-pass filter can be realized by implementing the circuit 350 with the circuit shown in FIG. 9(b). A capacitor 920 with a capacitance value of $C_1$ in parallel with an inductor 930 with an inductance value of $L_1$ are coupled between to the second terminal 354 of the circuit 350 and a power supply terminal with a predetermined voltage reference level (e.g., ground as shown in FIG. 9(b)). In this example, the admittance of the circuit 350 is $Y(s)=(sC_1+1/(sL_1))$. By configuring $I_{i1}=I_{in}$, $g_{m1}=g_{m2}=g_m$, and $Y(s)=(sC_1+1/(sL_1))$, and substituting these parameters into Eq. (1) or Eq. (2), the transfer function of the second-order all-pass filter is shown in Eq. (8) above.

Another second-order all-pass filter can be realized by implementing the circuit 350 with the circuit shown in FIG. 9(c1) or FIG. 9(c2). An impedance containing the inductor 940A with an inductance value of $L_1$ in series with the capacitor 950A with a capacitance value $C_1$ is coupled between the second terminal 354 of the circuit 350 and a power supply terminal with a predetermined voltage reference level (e.g., ground as shown in FIG. 9(c1)). The admittance of the circuit 350 is $Y(s)=1/(sL_1+1/(sC_1))$. Alternatively, an impedance containing the capacitor 950B with a capacitance value $C_1$ in series with the inductor 940B with an inductance value of $L_1$ is coupled between the second-terminal 354 of the circuit 350 and a power supply terminal, where the power supply terminal has a predetermined voltage reference level (e.g., ground as shown in FIG. 9(c2)). By configuring $I_{i1}=I_{in}$, $g_{m1}=g_{m2}=g_m$, and $Y(s)=1/(sL_1+1/(sC_1))$, and substituting these parameters into Eq. (1) or Eq. (2), the transfer function of the second-order all-pass filter can be obtained.

In some embodiments, the circuit arrangement using the inductor 940A of FIG. 9(c1) may involve two OTAs but may be affected by the parasitic capacitance of both the terminals of the floating capacitor. On the other hand, the circuit arrangement using the inductor 940B of FIG. 9(c2) may involve three OTAs but may not be affected by the parasitic capacitance of the capacitor bottom plate as it uses grounded capacitors throughout.

An N-th order all-pass filter can be realized by implementing the circuit 350 with the LC ladder network 960 as shown in FIG. 9(d) or the LC ladder network 970 as shown in FIG. 9(e). The N-th order all-pass filter can be realized by configuring $I_{i1}=I_{in}$ and $g_{m1}=g_{m2}=g_m$. The transfer function of the N-th order all-pass filter can be obtained by substituting for Y(s) the admittance of the LC ladder networks 960 or 970 into Eq. (2) above. In some examples, the inductor(s) in FIG. 9(d) and FIG. 9(e) can be implemented with the OTA-C simulated inductor 1000 or 1100, respectively shown in FIGS. 10 and 11.

Figure 4:
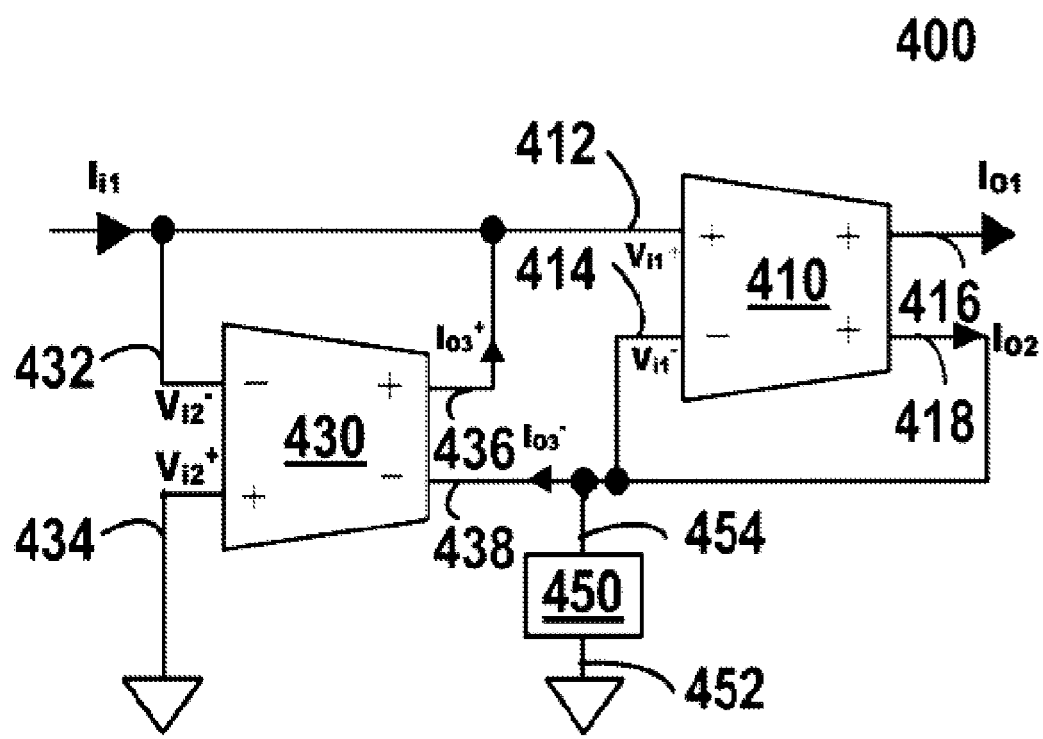
FIG. 4 shows a simplified block diagram of an example single input OTA-based inverting (−) type filter.

FIG. 4 illustrates a simplified block diagram of an example OTA-based current-mode filter 400 arranged in accordance at least some embodiments of the present disclosure. The filter 400 includes a DO-OTA 410 with a non-inverting (+) input 412, an inverting (−) input 414, and two non-inverting (+) outputs 416 and 418. The filter 400 also includes a DO-OTA 430 with a non-inverting (+) input 434, an inverting (−) input 432, a non-inverting (+) output 436, and an inverting (−) output 438. The filter 400 further includes a circuit 450 with a first terminal 452 and a second terminal 454. The first DO-OTA 410 has a characteristic transconductance $g_{m1}$. The second DO-OTA 430 has a characteristic transconductance $g_{m2}$. The DO-OTA 410 and the DO-OTA 430 may have substantially the same characteristic transconductance $g_m$. The circuit 450 has a characteristic admittance Y(s). The illustrated DO-OTA 430 behaves like a resistor of value $1/g_{m2}$.

The inverting (−) input 414 of the DO-OTA 410 is coupled to the circuit 450, the non-inverting (+) output 418 of the DO-OTA 410, and the inverting (−) output 438 of the DO-OTA 430. The non-inverting (+) input 412 of the DO-OTA 410 is coupled to the inverting (−) input 432 and the non-inverting (+) output 436 of the DO-OTA 430. The first terminal 452 of the circuit 450 and the non-inverting (+) input 434 of the DO-OTA 430 are coupled to a power supply terminal with a predetermined voltage reference level (e.g., $V_X$, $V_{DD}$, $V_{SS}$, $V_{GND}$, etc.). A current input, $I_{i1}$, is fed to the non-inverting (+) input 412 of the DO-OTA 410 and the inverting (−) input 432 of the DO-OTA 430. The inverting (−) output 438 of the DO-OTA 430 provides a current output, $I_{O3}$, which is substantially the same as the current input, $I_{i1}$. The non-inverting (+) outputs 416 and 418 of DO-OTA 410 respectively provide output currents $I_{O1}$ and a current $I_{O2}$. The current outputs $I_{O1}$, $I_{O2}$ of the first DO-OTA are determined by the voltages $V_{i1}^+$, $V_{i1}^-$ applied across inputs 412 and 414, where $I_{O1}=I_{O2}=g_{m1}\cdot(V_{i1}^+-V_{i1}^-)$. The current outputs $I_{O3}^+$, $-I_{O3}^-$ of the second DO-OTA are determined by the voltage $(V_{i2}^+, V_{i2}^-)$ applied across inputs 434 and 432, where $I_{O3}^+=I_{O3}^-=g_{m2}\cdot(V_{i2}^+-V_{i2}^-)$.

The input-output relation of the filter 400 in FIG. 4 is same as the filter 200 in FIG. 2 and is as given in Eq. (10) above.

Accordingly, by configuring $I_{i1}=I_{in}$ and $g_{m1}=g_{m2}=g_m$, the filter 400 realizes the transfer function as given in Eq. (11) above.

The circuit 450 can be implemented with the circuit shown in FIG. 9(a). A capacitor 910 with a capacitance value of $C_1$ is coupled between the second terminal 454 of the circuit 450 and a power supply terminal with a predetermined voltage reference level (e.g., ground as shown in FIG. 9(a)). The admittance of the circuit 450 is $Y(s)=sC_1$. By configuring $I_{i1}=I_{in}$, $g_{m1}=g_{m2}=g_m$, and $Y(s)=sC_1$, and substituting these parameters into Eq. (10) or Eq. (11), the filter 400 acts as a first-order inverting type all-pass filter, and the transfer function is shown in Eq. (14) above.

A second-order all-pass filter can be realized by implementing the circuit 450 with the circuit shown in FIG. 9(b). A capacitor 920 with a capacitance value of $C_1$ in parallel with an inductor 930 with an inductance value of $L_1$ are coupled between the second terminal 454 of the circuit 450 and a power supply terminal with a predetermined voltage reference level (e.g., ground as shown in FIG. 9(b)). In this example, the admittance of the circuit 450 is $Y(s)=(sC_1+1/(sL_1))$. By configuring $I_{i1}=I_{in}$, $g_{m1}=g_{m2}=g_m$, and $Y(s)=(sC_1+1/(sL_1))$, and substituting these parameters into Eq. (10) or Eq. (11), the transfer function of the second-order all-pass filter is shown in Eq. (17) above.

Another second-order all-pass filter can be realized by implementing the circuit 450 with the circuit shown in FIG. 9(c1) or FIG. 9(c2). An impedance containing the inductor 940A with an inductance value of $L_1$ in series with the capacitor 950A with a capacitance value $C_1$ is coupled between the second terminal 454 of the circuit 450 and a power supply terminal with a predetermined voltage reference level (e.g., ground as shown in FIG. 9(c1)). Alternately, an impedance containing the capacitor 950B with a capacitance value $C_1$ in series with the inductor 940B with an inductance value $I_1$ is coupled between the second-terminal 454 of the circuit 450 and a power supply terminal, where the power supply terminal has a predetermined voltage reference level (e.g., ground as shown in FIG. 9(c2)). The admittance of the circuit 450 is $Y(s)=1/(sL_1+1/(sC_1))$. By configuring $I_{i1}=I_{in}$, $g_{m1}=g_{m2}=g_m$, and $Y(s)=1/(sL_1+1/(sC_1))$, and substituting these parameters into Eq. (10) or Eq. (11), the transfer function of the second-order all-pass filter can be obtained.

An N-th order all-pass filter can be realized by implementing the circuit 450 with the LC ladder network 960 as shown in FIG. 9(d) or the LC ladder network 970 as shown in FIG. 9(e). The N-th order all-pass filter can be realized by configuring $I_{i1}=I_{in}$ and $g_{m1}=g_{m2}=g_m$. The transfer function of the N-th order all-pass filter can be obtained by substituting the parameters and the admittance of the LC ladder networks 960 or 970 into Eq. (11) above. In some examples, the inductor(s) in FIG. 9(d) and FIG. 9(e) can be implemented with the OTA-C simulated inductor 1000 or 1100, respectively shown in FIGS. 10 and 11.

Figure 5:
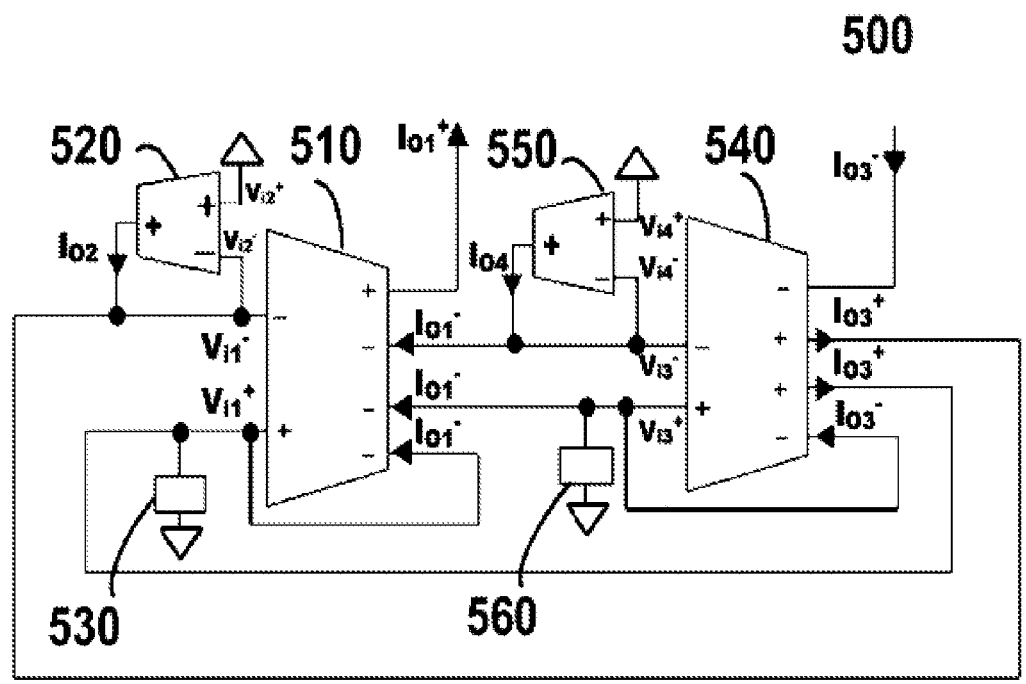
FIG. 5 shows a simplified block diagram of an example quadrature oscillator with the OTA-based non-inverting (+) type filters.

FIG. 5 illustrates a simplified block diagram of an example current-mode quadrature oscillator 500 with two first-order all-pass filters, arranged in accordance with at least some embodiments of the present disclosure. A four-output-OTA 510, a SO-OTA 520, and a circuit 530 have a structure similar to the filter in FIG. 1 with two more inverting (−) outputs from the four-output-OTA 510, which are coupled to the inverting (−) input and non-inverting (+) input of a four-output-OTA 540, respectively. The four-output-OTA 510 has a characteristic transconductance $g_{m510}$ and the SO-OTA 520 has a characteristic transconductance $g_{m520}$. The current outputs ($I_{O1}^+$, $-I_{O1}^-$, $-I_{O1}^-$, $-I_{O1}^{-1}$) of the four-output-OTA 510 are determined by the voltage ($V_{i1}^+$, $V_{i1}^-$) applied across the non-inverting (+) and inverting (−) inputs, i.e., $I_{O1}{}^+=-I_{O1}{}^-=g_{m510}\cdot(V_{i1}{}^+-V_{i1}{}^-)$. The current output of the SO-OTA 520 ($I_{O2}$) is determined by the voltage applied across the non-inverting (+) and inverting (−) inputs ($V_{i2}{}^+$, $V_{i2}{}^-$), i.e., $I_{O2}=g_{m520}\cdot(V_{i2}{}^+-V_{i2}{}^-)$ In some embodiments, $V_{i2}+$ and $V_{i4}+$ are equal to ground voltage, when the non-inverting inputs of the SO-OTA 520 and the SO-OTA 550 are coupled to ground. The four-output-OTA 540, a SO-OTA 550, and a circuit 560 also have a structure similar to the circuit in FIG. 1 with one more inverting (−) output and one more non-inverting (+) output from the four-output-OTA 540. The four-output-OTA 540 has a characteristic transconductance $g_{m540}$ and the SO-OTA 550 has a characteristic transconductance $g_{m550}$. The current outputs ($-I_{O3}{}^-$, $I_{O3}{}^+$, $I_{O3}{}^+$, $I_{O3}{}^-$) of the four-output-OTA 540 are determined by the voltage ($V_{i3}{}^+$, $V_{i3}{}^-$) applied across the non-inverting (+) and inverting (−) inputs, i.e., $I_{O3}{}^+=-I_{O3}{}^-=g_{m540}\cdot(V_{i3}{}^+-V_{i3}{}^-)$. The current output of the SO-OTA 550 ($I_{O4}$) is determined by the voltage applied across the non-inverting (+) and inverting (−) inputs ($V_{i4}{}^+$, $V_{i4}{}^-$), i.e., $I_{O4}=g_{m550}\cdot(V_{i4}{}^+-V_{i4}{}^-)$. Two non-inverting (+) outputs of the four-output-OTA 540 are coupled to the inverting (−) input and non-inverting (+) input of the OTA 510, respectively. In this example, the circuits 530 and 560 are implemented with the capacitance circuit shown in FIG. 9(a). When the OTAs 510, 520, 540, and 550 are configured to have substantially the same transconductance $g_m$, and the capacitance value of the circuits 530 and 560 are configured to have substantially the same capacitance value of C, the first-order all-pass filter composed of the four-output-OTA 510, SO-OTA 520, and circuit 530, and the first-order all-pass filter composed of the four-output-OTA 540, SO-OTA 550, and circuit 560 constitute the quadrature oscillator 500, which oscillates at an angular frequency, $\omega_O=g_m/C$. The illustrated SO-OTAs 520 and 550 behave like resistors of value $1/g_{m520}$ and $1/g_{m550}$, respectively.

Figure 6:
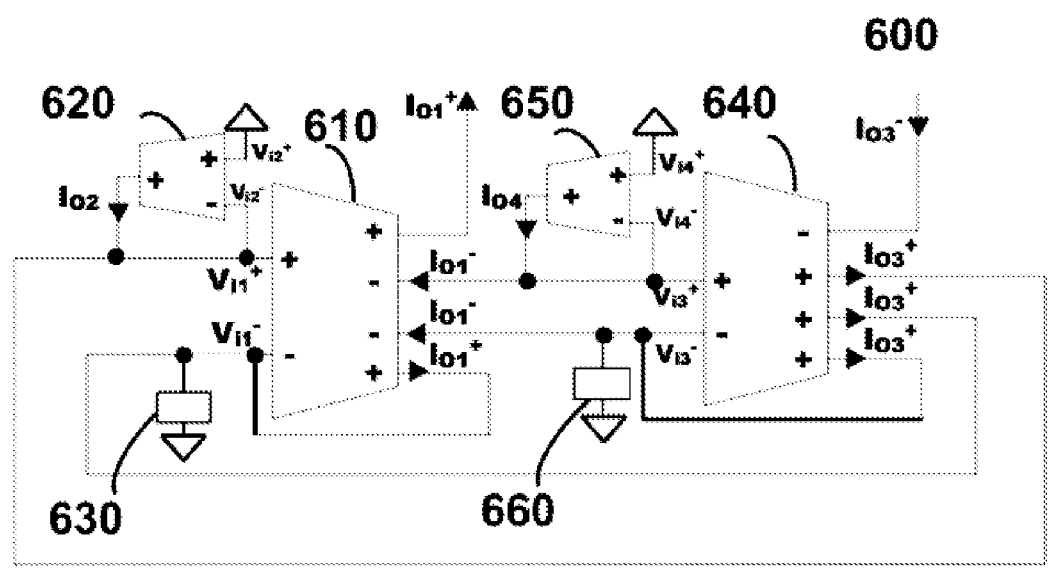
FIG. 6 shows a simplified block diagram of an example quadrature oscillator with the OTA-based inverting (−) type filters.

FIG. 6 illustrates a simplified block diagram of an example current-mode quadrature oscillator 600 with two first-order all-pass filters, arranged in accordance with at least some embodiments of the present disclosure. A four-output-OTA 610, a SO-OTA 620, and a circuit 630 have a structure similar to the filter in FIG. 2 with two more inverting (−) outputs from the four-output-OTA 610, which are coupled to the inverting (−) input and non-inverting (+) input of a four-output-OTA 640, respectively. The four-output-OTA 610 has a characteristic transconductance $g_{m610}$ and the SO-OTA 620 has a characteristic transconductance $g_{m620}$. The current outputs ($I_{O1}{}^+$, $-I_{O1}{}^-$, $-I_{O1}{}^-$, $I_{O1}{}^+$) of the four-output-OTA 610 are determined by the voltage ($V_{i1}{}^+$, $V_{i1}{}^-$) applied across the non-inverting (+) and inverting (−) inputs, i.e., $I_{O1}{}^+=-I_{O1}{}^-=g_{m610}\cdot(V_{i1}{}^+-V_{i1}{}^-)$. The current output of the SO-OTA 620 ($I_{O2}$) is determined by the voltage applied across the non-inverting (+) and inverting (−) inputs ($V_{i2}{}^+$, $V_{i2}{}^-$), i.e., $I_{O2}=g_{m620}\cdot(V_{i2}{}^+-V_{i2}{}^-)$. In some embodiments, $V_{i2}+$ and $V_{i4}+$ are equal to ground voltage, when the non-inverting inputs of the SO-OTA 620 and the SO-OTA 650 are coupled to ground. The four-output-OTA 640, a SO-OTA 650, and a circuit 660 also have a structure similar to the circuit in FIG. 2 with one more inverting (−) output and one more non-inverting (+) output from the four-output-OTA 640. The four-output-OTA 640 has a characteristic transconductance $g_{m640}$ and the SO-OTA 650 has a characteristic transconductance $g_{m650}$. The current outputs ($-I_{O3}{}^-$, $I_{O3}{}^+$, $I_{O3}{}^+$, $-I_{O3}{}^-$) of the four-output-OTA 640 are determined by the voltage ($V_{i3}{}^+$, $V_{i3}{}^-$) applied across the non-inverting (+) and inverting (−) inputs, i.e., $I_{O3}{}^+=-I_{O3}{}^-=g_{m640}\cdot(V_{i3}{}^+-V_{i3}{}^-)$. The current output of the SO-OTA 650 ($I_{o4}$) is determined by the voltage applied across the non-inverting (+) and inverting (−) inputs ($V_{i4}{}^+$, $V_{i4}{}^-$), i.e., $I_{O4}=g_{m650}\cdot(V_{i4}{}^+-V_{i4}{}^-)$. Two non-inverting (+) outputs of the four-output-OTA 640 are coupled to the inverting (−) input and non-inverting (+) input of the OTA 610, respectively. In this example, the circuits 630 and 660 are implemented with the capacitance circuit shown in FIG. 9(a). When the OTAs 610, 620, 640, and 650 are configured to have substantially the same transconductance $g_m$, and the capacitance value of the circuits 630 and 660 are configured to have substantially the same capacitance value of C, the first-order all-pass filter composed of the four-output-OTA 610, SO-OTA 620, and circuit 630, and the first-order all-pass filter composed of the four-output-OTA 640, SO-OTA 650, and circuit 660 constitute the quadrature oscillator 600, which oscillates at an angular frequency, $\omega_O=g_m/C$. The illustrated OTAs 620 and 650 behave like resistors of value $1/g_{m620}$ and $1/g_{m650}$, respectively.

Figure 7:
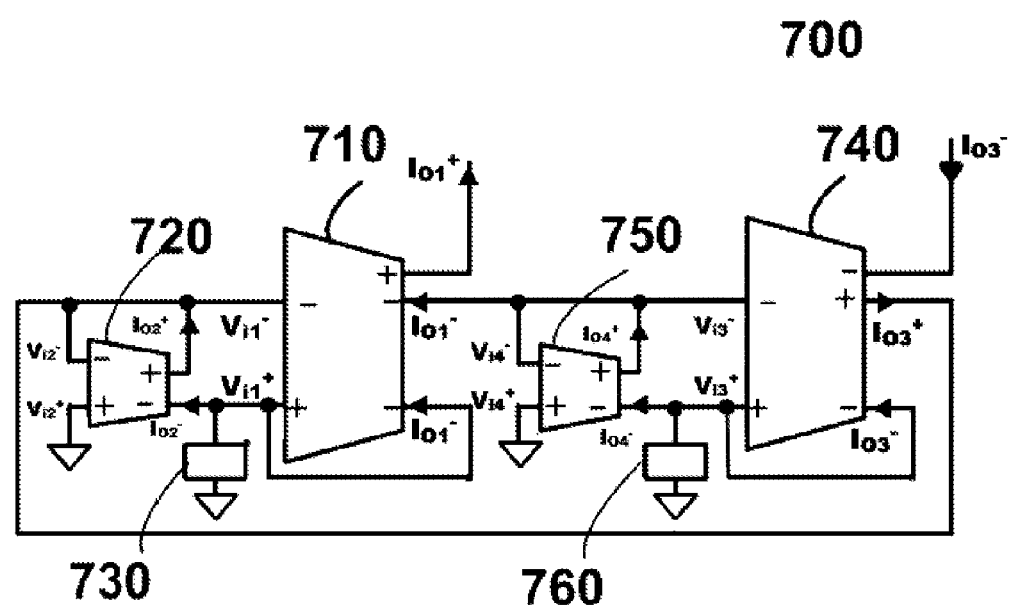
FIG. 7 shows a simplified block diagram of an example quadrature oscillator with the single input OTA-based non-inverting (+) type filters.

FIG. 7 illustrates a simplified block diagram of an example current-mode quadrature oscillator 700 with two first-order all-pass filters, arranged in accordance with at least some embodiments of the present disclosure. A three-output-OTA 710, a DO-OTA 720, and a circuit 730 have a structure similar to the filter in FIG. 3 with one more inverting (−) output from the three-output-OTA 710. The non-inverting (+) output of the three-output-OTA 740 is coupled to the inverting (−) input of the OTA 710. The three-output-OTA 710 has a characteristic transconductance $g_{m710}$ and the DO-OTA 720 has a characteristic transconductance $g_{m720}$. The current outputs ($I_{O1}{}^+$, $-I_{O1}{}^-$, $-I_{O1}{}^-$) of the three-output-OTA 710 are determined by the voltage ($V_{i1}{}^+$, $V_{i1}{}^-$) applied across the non-inverting (+) and inverting (−) inputs, i.e., $I_{O1}{}^+=-I_{O1}{}^-=g_{m710}\cdot(V_{i1}{}^+-V_{i1}{}^-)$. The current output of the DO-OTA 720 ($I_{O2}{}^+$, $I_{O2}{}^-$) is determined by the voltage applied across the non-inverting (+) and inverting (−) inputs ($V_{i2}{}^+$, $V_{i2}{}^-$), i.e., $I_{O2}{}^+=-I_{O2}{}^-=g_{m720}\cdot(V_{i2}{}^+-V_{i2}{}^-)$. The three-output-OTA 740, a DO-OTA 750, and a circuit 760 also have a structure similar to the circuit in FIG. 3 with one more inverting (−) output from the three-output-OTA 740. The non-inverting (+) output of the three-output-OTA 740 is coupled to the inverting (−) input of the OTA 710. The three-output-OTA 740 has a characteristic transconductance $g_{m740}$ and the DO-OTA 750 has a characteristic transconductance $g_{m750}$. The current outputs ($-I_{O3}{}^-$, $I_{O3}{}^+$, $-I_{O3}{}^-$) of the three-output-OTA 740 are determined by the voltage ($V_{i3}{}^+$, $V_{i3}{}^-$) applied across the non-inverting (+) and inverting (−) inputs, i.e., $I_{O3}{}^+=-I_{O3}{}^-=g_{m740}\cdot(V_{i3}{}^+-V_{i3}{}^-)$. The current outputs of the DO-OTA 750 ($I_{O4}{}^+$, $I_{O4}{}^-$) are determined by the voltage applied across the non-inverting (+) and inverting (−) inputs ($V_{i4}{}^+$, $V_{i4}{}^-$), i.e., $I_{O4}{}^+=-I_{O4}{}^-=g_{m750}\cdot(V_{i4}{}^+-V_{i4}{}^-)$. In this example, the circuits 730 and 760 are implemented with the capacitance circuit shown in FIG. 9(a). When the OTAs 710, 720, 740, and 750 are configured to have substantially the same transconductance $g_m$, and the capacitance value of the circuits 730 and 760 are configured to have substantially the same capacitance value of C, the first-order all-pass filter composed of the three-output-OTA 710, DO-OTA 720, and the circuit 730, and the first-order all-pass filter composed of the three-output-OTA 740, the SO-OTA 750, and the circuit 760 constitute the quadrature oscillator 700, which oscillates at an angular frequency, $\omega_O=g_m/C$. The illustrated OTAs 720 and 750 behave like resistors of value $1/g_{m720}$ and $1/g_{m750}$, respectively.

Figure 8:
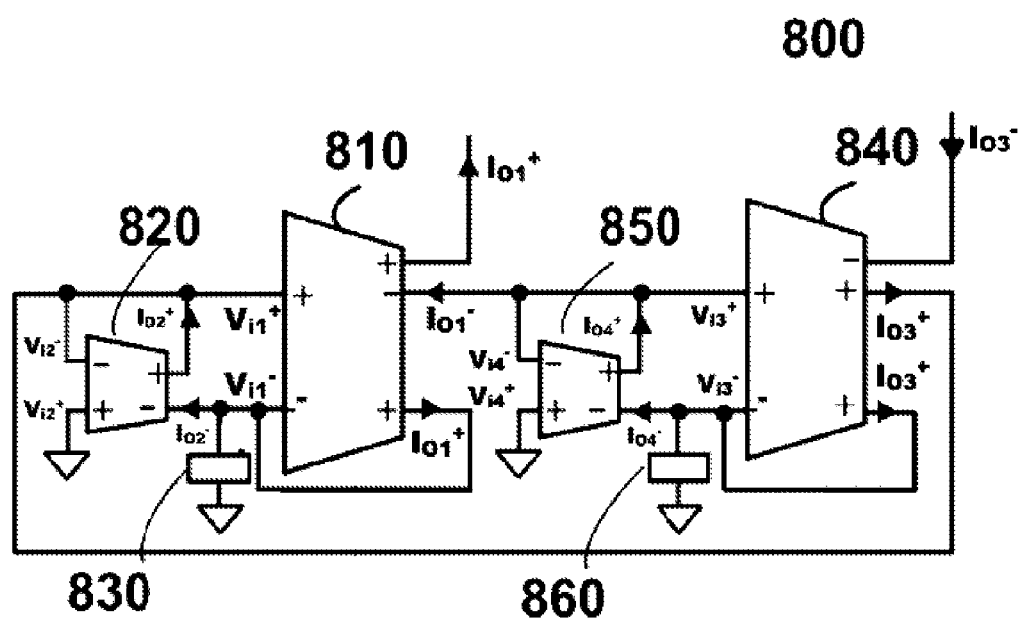
FIG. 8 shows a simplified block diagram of an example quadrature oscillator with the single input OTA-based inverting (−) type filters.

FIG. 8 illustrates a simplified block diagram of an example current-mode quadrature oscillator 800 with two first-order all-pass filters, arranged in accordance with at least some embodiments of the present disclosure. A three-output-OTA 810, a DO-OTA 820, and a circuit 830 have a structure similar to the filter in FIG. 4 with one more inverting (−) output from the three-output-OTA 810. The inverting (−) output of the three-output-OTA 810 is coupled to the non-inverting (+) input of the OTA 840. The three-output-OTA 810 has a characteristic transconductance $g_{m810}$, and the DO-OTA 820 has a characteristic transconductance $g_{m820}$. The current outputs ($I_{O1}^+$, $-I_{O1}^-$, $I_{O1}^+$) of the three-output-OTA 810 are determined by the voltage ($V_{i1}^+$, $V_{i1}^-$) applied across the non-inverting (+) and inverting (−) inputs, i.e., $I_{O1}^+ = -I_{O1}^- = g_{m810} \cdot (V_{i1}^+ - V_{i1}^-)$. The current output of the DO-OTA ($I_{O2}^+$, $-I_{O2}^-$) is determined by the voltage applied across the non-inverting (+) and inverting (−) inputs ($V_{i2}^+$, $V_{i2}^-$), i.e., $I_{O2}^+ = -I_{O2}^- = g_{m820} \cdot (V_{i2}^+ - V_{i2}^-)$. The three-output-OTA 840, a DO-OTA 850, and a circuit 860 also have a structure similar to the circuit in FIG. 4 with one more inverting (−) output from the three-output-OTA 840. The non-inverting (+) output of the three-output-OTA 840 is coupled to the non-inverting (+) input of the OTA 810. The three-output-OTA 840 has a characteristic transconductance $g_{m840}$ and the DO-OTA 850 has a characteristic transconductance $g_{m850}$. The current outputs ($-I_{O3}$, $I_{O3}^+$, $I_{O3}^+$) of the three-output-OTA 840 are determined by the voltage ($V_{i3}^+$, $V_{i3}^-$) applied across the non-inverting (+) and inverting (−) inputs, i.e., $I_{O3}^+ = -I_{O3}^- = g_{m840} \cdot (V_{i3}^+ - V_{i3}^-)$. The current output of the DO-OTA ($I_{O4}^+$, $-I_{O4}^-$) is determined by the voltage applied across the non-inverting (+) and inverting (−) inputs ($V_{i4}^+$, $V_{i4}^-$), i.e., $I_{O4}^+ = -I_{O4}^- = g_{m850} \cdot (V_{i4}^+ - V_{i4}^-)$. In this example, the circuits 830 and 860 are implemented with the capacitance circuit shown in FIG. 9(a). When the OTAs 810, 820, 840, and 850 are configured to have substantially the same transconductance $g_m$, the capacitance value of the circuits 830 and 860 are configured to have substantially the same capacitance value of C, the first-order all-pass filter composed of the three-output-OTA 810, DO-OTA 820, and the circuit 830, and the first-order all-pass filter composed of the three-output-OTA 840, SO-OTA 850, and circuit 860 constitute the quadrature oscillator 800, which oscillates at an angular frequency, $\omega_O = g_m / C$. The illustrated OTAs 820 and 850 behave like resistors of value $1/g_{m820}$ and $1/g_{m850}$, respectively.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A quadrature oscillator, comprising:
 a first filter, comprising:
  a first capacitor coupled to a first node, wherein the first node is a common node that is either a circuit ground node, a voltage reference node, or a power supply node;

a first operational transconductance amplifier (OTA), comprising:
  an inverting input;
  a non-inverting input coupled to the first capacitor;
  a first inverting output;
  a second inverting output;
  a third inverting output coupled to the first capacitor; and
  a non-inverting output; and
a second OTA, comprising:
  a non-inverting input coupled to the first node;
  an inverting input coupled to the inverting input of the first OTA; and
  a non-inverting output coupled to the inverting input of the first OTA; and
a second filter, comprising:
  a second capacitor coupled to the first node;
  a third OTA, comprising:
    an inverting input coupled to the first inverting output of the first OTA;
    a non-inverting input coupled to the second inverting output of the first OTA and the second capacitor;
    a first non-inverting output coupled to the inverting input of the first OTA;
    a second non-inverting output coupled to the non-inverting input of the first OTA;
    a first inverting output coupled to the second capacitor; and
    a second inverting output; and
  a fourth OTA, comprising:
    a non-inverting input coupled to the first node;
    an inverting input coupled to the inverting input of the third OTA; and
    a non-inverting output coupled to the inverting input of the third OTA;
wherein the first OTA, the second OTA, the third OTA, and the fourth OTA have substantially the same transconductance, and the first capacitor and the second capacitor have substantially the same capacitance value.

2. A quadrature oscillator, comprising:
a first filter, comprising:
  a first capacitor coupled to a first node, wherein the first node is a common node that is either a circuit ground node, a voltage reference node, or a power supply node;
  a first operational transconductance amplifier (OTA), comprising:
    an inverting input;
    a non-inverting input coupled to the first capacitor;
    a first inverting output;
    a second inverting output coupled to the first capacitor; and
    a non-inverting output; and
  a second OTA, comprising:
    a non-inverting input coupled to the first node;
    an inverting input coupled to the inverting input of the first OTA;
    a non-inverting output coupled to the inverting input of the first OTA; and
    an inverting output coupled to the non-inverting input of the first OTA; and
a second filter, comprising:
  a second capacitor coupled to the first node;
  a third OTA, comprising:
    an inverting input coupled to the first inverting output of the first OTA;
    a non-inverting input coupled to the second capacitor;
    a non-inverting output coupled to the inverting input of the first OTA;
    a first inverting output coupled to the second capacitor; and
    a second inverting output; and
  a fourth OTA, comprising:
    a non-inverting input coupled to the first node;
    an inverting input coupled to the inverting input of the third OTA;
    a non-inverting output coupled to the inverting input of the third OTA; and
    an inverting output coupled to the non-inverting input of the third OTA;
wherein the first OTA, the second OTA, the third OTA, and the fourth OTA have substantially the same transconductance, and the first capacitor and the second capacitor have substantially the same capacitance value.

3. A quadrature oscillator, comprising:
a first filter, comprising:
  a first capacitor coupled to a first node, wherein the first node is a common node that is either a circuit ground node, a voltage reference node, or a power supply node;
  a first operational transconductance amplifier (OTA), comprising:
    a non-inverting input;
    an inverting input coupled to the first capacitor;
    a first inverting output;
    a second inverting output;
    a first non-inverting output coupled to the first capacitor; and
    a second non-inverting output;
  a second OTA, comprising:
    a non-inverting input coupled to the first node;
    an inverting input coupled to the non-inverting input of the first OTA; and
    a non-inverting output coupled to the non-inverting input of the first OTA; and
a second filter, comprising:
  a second capacitor coupled to the first node;
  a third OTA, comprising:
    a non-inverting input coupled to the first inverting output of the first OTA;
    an inverting input coupled to the second inverting output of the first OTA and the second capacitor;
    a first non-inverting output coupled to the non-inverting input of the first OTA;
    a second non-inverting output coupled to the inverting input of the first OTA;
    a third non-inverting output coupled to the second capacitor; and
    an inverting output; and
  a fourth OTA, comprising:
    a non-inverting input coupled to the first node;
    an inverting input coupled to the non-inverting input of the third OTA; and
    a non-inverting output coupled to the non-inverting input of the third OTA;

wherein the first OTA, the second OTA, the third OTA, and the fourth OTA have substantially the same transconductance, and the first capacitor and the second capacitor have substantially the same capacitance value.

4. A quadrature oscillator, comprising:
a first filter, comprising:
   a first capacitor coupled to a first node, wherein the first node is a common node that is either a circuit ground node, a voltage reference node, or a power supply node;
   a first operational transconductance amplifier (OTA), comprising:
      a non-inverting input;
      an inverting input coupled to the first capacitor;
      an inverting output;
      a first non-inverting output coupled to the first capacitor; and
      a second non-inverting output;
   a second OTA, comprising:
      a non-inverting input coupled to the first node;
      an inverting input coupled to the non-inverting input of the first OTA;
      a non-inverting output coupled to the non-inverting input of the first OTA; and
      an inverting output coupled to the inverting input of the first OTA; and
a second filter, comprising:
   a second capacitor coupled to the first node;
   a third OTA, comprising:
      a non-inverting input coupled to the inverting output of the first OTA;
      an inverting input coupled to the second capacitor;
      a first non-inverting output coupled to the non-inverting input of the first OTA;
      a second non-inverting output coupled to the second capacitor; and
      a second inverting output; and
   a fourth OTA, comprising:
      a non-inverting input coupled to the first node;
      an inverting input coupled to the non-inverting input of the third OTA;
      a non-inverting output coupled to the non-inverting input of the third OTA; and
      an inverting output coupled to the inverting input of the third OTA;
   wherein the first OTA, the second OTA, the third OTA, and the fourth OTA have substantially the same transconductance, and the first capacitor and the second capacitor have substantially the same capacitance value.

* * * * *

UNITED STATES PATENT AND TRADEMARK OFFICE
CERTIFICATE OF CORRECTION

PATENT NO. : 8,659,363 B2
APPLICATION NO. : 13/381977
DATED : February 25, 2014
INVENTOR(S) : Kamat et al.

It is certified that error appears in the above-identified patent and that said Letters Patent is hereby corrected as shown below:

On the Title Page, item (75), under "Inventors", in Column 1, Line 3, delete "K," and insert -- K., --, therefor.

On the Title Page, item (56), References Cited, under "OTHER PUBLICATIONS", in Column 2, Line 8, delete "Turorial"," and insert -- Tutorial", --, therefor.

On Title Page 2, item (56), References Cited, under "OTHER PUBLICATIONS", in Column 1, Line 4, delete "Anada Mohan," and insert -- Ananda Mohan, --, therefor.

On Title Page 2, item (56), References Cited, under "OTHER PUBLICATIONS", in Column 1, Line 9, delete "Ampifiers"," and insert -- Amplifiers", --, therefor.

On Title Page 2, item (56), References Cited, under "OTHER PUBLICATIONS", in Column 2, Line 10, delete "856-861 vol." and insert -- 856-861, vol. --, therefor.

In the Specification

In Column 3, Line 55, delete "$I_{i1}=I_{i2}=I_{im}$" and insert -- $I_{i1}=I_{i2}=I_{in}$ --, therefor.

In Column 5, Line 16, delete "$I_{i2}=g_{in}$," and insert -- $I_{i2}=I_{in}$, --, therefor.

In Column 5, Lines 55-56, delete "conductor 1000" and insert -- inductor 1000 --, therefor.

In Column 7, Line 4, delete "conductor 1100" and insert -- inductor 1100 --, therefor.

In Column 8, Line 35, in Eq. (11), delete "$H(s) = \dfrac{I_o}{I_{in}} = \dfrac{(Y(s)-g_m)}{(Y(s)-g_m)}$" and insert Signed and Sealed this
First Day of July, 2014

Michelle K. Lee
*Deputy Director of the United States Patent and Trademark Office*

CERTIFICATE OF CORRECTION (continued)
U.S. Pat. No. 8,659,363 B2

In Column 9, Line 21, in Eq. (15), delete "$H(s) = \frac{I_o}{I_{in}} = \frac{(Y(s) - g_m)}{(Y(s) + g_m)}$" --, therefor.

In Column 9, Line 21, in Eq. (15), delete "$H(s) = \frac{I_o}{I_{in}} = \frac{\frac{g_m}{C_1}}{\left(s + \frac{g_m}{C_1}\right)}$" and insert -- $H(s) = \frac{I_o}{I_{in}} = \frac{\frac{g_m}{C_1}}{\left(s + \frac{g_m}{C_1}\right)}$ --, therefor.

In Column 10, Line 17, delete "conductor 1000" and insert -- inductor 1000 --, therefor.

In Column 10, Line 45, delete "$H(s) = \frac{I_o}{I_{in}} = \frac{(s^2 \cdot g_m \cdot L_1 \cdot C_1 - s \cdot C_1 + g_m)}{(s^2 \cdot g_m \cdot L_1 \cdot C_1 + s \cdot C_1 + g_m)}$" and insert -- $H(s) = \frac{I_o}{I_{in}} = \frac{(s^2 \cdot g_m \cdot L_1 \cdot C_1 - s \cdot C_1 + g_m)}{(s^2 \cdot g_m \cdot L_1 \cdot C_1 + s \cdot C_1 + g_m)}$ --, therefor.

In Column 10, Line 60, delete "$H(s) = \frac{I_o}{I_{in}} = \frac{s^2 \cdot g_m \cdot L_1 \cdot C_1 + g_m}{(s^2 \cdot g_m \cdot L_1 \cdot C_1 + s \cdot C_1 + g_m)}$" and insert -- $H(s) = \frac{I_o}{I_{in}} = -\frac{s^2 \cdot g_m \cdot L_1 \cdot C_1 + g_m}{(s^2 \cdot g_m \cdot L_1 \cdot C_1 + s \cdot C_1 + g_m)}$ --, therefor.

In Column 12, Line 26, delete "($I_{O1}^+$, $I_{O1}^-$)" and insert -- ($I_{O1}^+$, -$I_{O1}^-$) --, therefor.

In Column 13, Line 65, delete "$I_{O3}^+ = I_{O3}^- = g_{m2} \cdot (V_{i2}^+ - V_{i2}^-)$" and insert -- $I_{O3}^+ = -I_{O3}^- = g_{m2} \cdot (V_{i2}^+ - V_{i2}^-)$ --, therefor.

In Column 15, Line 1, delete "$I_{O1}^+ = -I_{O1} = g_{m510}$·" and insert -- $I_{O1}^+ = -I_{O1}^- = g_{m510}$· --, therefor.

In Column 15, Line 5, delete "($V_{i2}^+ - V_{i2}^-$) In" and insert -- ($V_{i2}^+ - V_{i2}^-$). In --, therefor.

In Column 15, Line 14, delete "(-$I_{O3}^-$, $I_{O3}^+$, $I_{O3}^+$, $I_{O3}^-$)" and insert -- (-$I_{O3}^-$, $I_{O3}^+$, $I_{O3}^+$, -$I_{O3}^-$) --, therefor.

In Column 16, Line 56, delete "SO-OTA 750," and insert -- DO-OTA 750, --, therefor.

In Column 17, Lines 10-11, delete "=-$I_{O2}$ =$g_{m820} \cdot (V_{i2}^+ - V_{i2}^-)$." and insert -- =-$I_{O2}^-$ =$g_{m820} \cdot (V_{i2}^+ - V_{i2}^-)$. --, therefor.

In Column 17, Line 20, delete "(-$I_{O3}$, $I_{O3}^+$, $I_{O3}^+$)" and insert -- (-$I_{O3}^-$, $I_{O3}^+$, $I_{O3}^+$) --, therefor.

CERTIFICATE OF CORRECTION (continued)
U.S. Pat. No. 8,659,363 B2

In Column 17, Lines 25-26, delete "=-$I_{O4}$=$g_{m850}\cdot(V_{i4}^{+} - V_{i4}^{-})$." and insert -- =-$I_{O4}^{-}$=$g_{m850}\cdot(V_{i4}^{+} - V_{i4}^{-})$. --, therefor.

In Column 17, Line 35, delete "SO-OTA 850," and insert -- DO-OTA 850, --, therefor.